United States Patent [19]

Nakano et al.

[11] Patent Number: 5,249,662
[45] Date of Patent: Oct. 5, 1993

[54] PARTS FEEDING APPARATUS

[75] Inventors: Hironobu Nakano, Hyogo; Atsushi Hagihara, Kasai; Syozo Kawashima, Ono; Kuniyoshi Nakashima, Kasai, all of Japan

[73] Assignee: Sanyo Electric Co., Ltd., Moriguchi, Japan

[21] Appl. No.: 926,363

[22] Filed: Aug. 10, 1992

Related U.S. Application Data

[63] Continuation of Ser. No. 504,225, Apr. 4, 1990, abandoned.

[30] Foreign Application Priority Data

Apr. 5, 1989 [JP] Japan .................. 1-86549
Apr. 20, 1989 [JP] Japan .................. 1-100760

[51] Int. Cl.⁵ .................................. B65G 37/00
[52] U.S. Cl. .................... 198/346.1; 198/803.01; 198/803.7
[58] Field of Search .......... 198/346.1, 803.01, 803.7, 198/465.1, 465.2, 465.3

[56] References Cited

U.S. PATENT DOCUMENTS

| | | | |
|---|---|---|---|
| 3,381,744 | 5/1968 | Taccone | 198/346.1 X |
| 4,159,762 | 7/1979 | Bulwith | 198/803.01 |
| 4,449,277 | 5/1984 | Hasegawa et al. | 198/346.1 X |
| 4,482,043 | 11/1984 | Bauman et al. | 198/346.1 |
| 4,520,919 | 6/1985 | Keitaro | 198/803.01 |
| 4,557,371 | 12/1985 | Yonezawa | 198/803.01 |
| 4,678,077 | 7/1987 | Bertorello | 198/803.7 X |
| 4,698,475 | 10/1987 | Lothenbach et al. | 198/803.01 X |
| 4,704,792 | 11/1987 | Itagaki et al. | 29/741 |
| 4,715,490 | 12/1987 | Date et al. | 198/346.1 |
| 4,829,665 | 5/1989 | Kabeshita et al. | 29/840 |

FOREIGN PATENT DOCUMENTS

| | | |
|---|---|---|
| 3740594A1 | 6/1988 | Fed. Rep. of Germany . |
| 61-239696 | 10/1986 | Japan . |
| 0099152 | 4/1988 | Japan .................. 198/346.1 |
| 63-269600 | 11/1988 | Japan . |

Primary Examiner—D. Glenn Dayoan
Attorney, Agent, or Firm—Nikaido, Marmelstein, Murray & Oram

[57] ABSTRACT

A parts feeding apparatus includes a parts feeding table detachably supporting parts cassettes. A working area wherein a rail is laid and a standby area are arranged in parallel with each other. A box or frame constituting a table positioning unit is movably supported on the rail. In feeding parts, the table is loaded on the box by a table transport unit provided between the working area and the standby area, and the box is moved on the rail, whereby the table is positioned such that the parts cassette can be brought at a parts taking-out position. The table transport unit unloads the table being laid on the box and transports the table thus unloaded to the standby area, and transports the table from the standby area to a charge station or transports the table from the charge station to the standby area.

11 Claims, 21 Drawing Sheets

F I G. 1
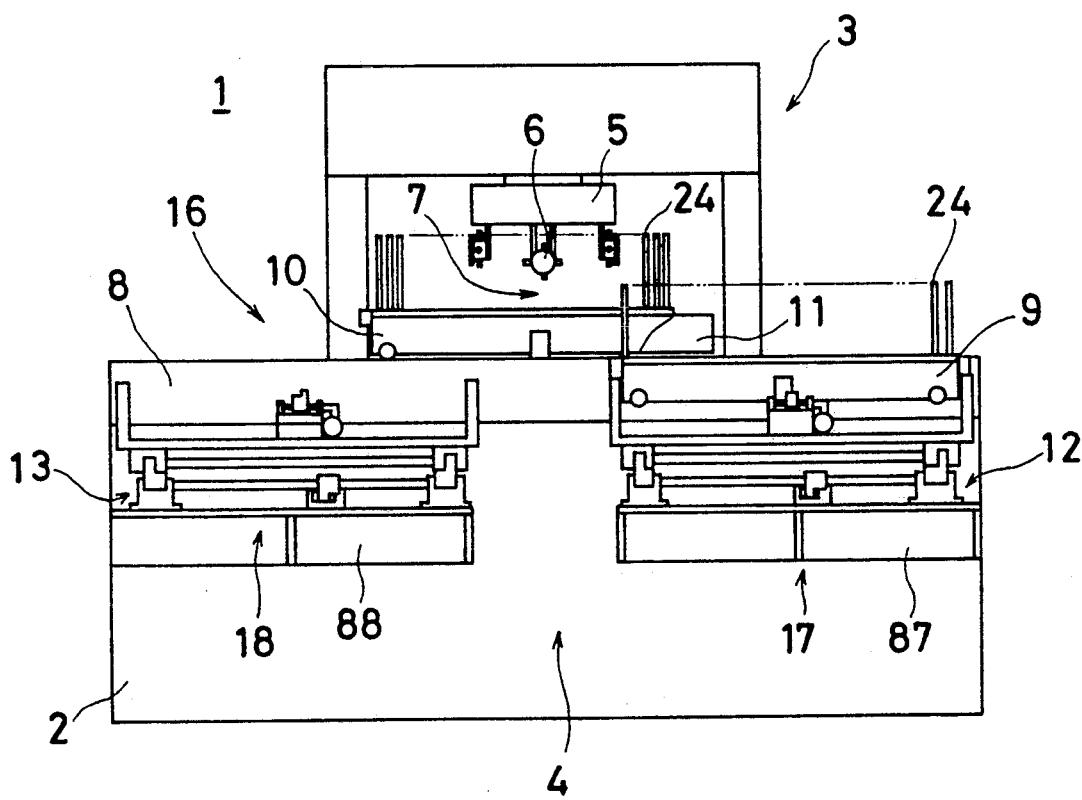

F I G. 2
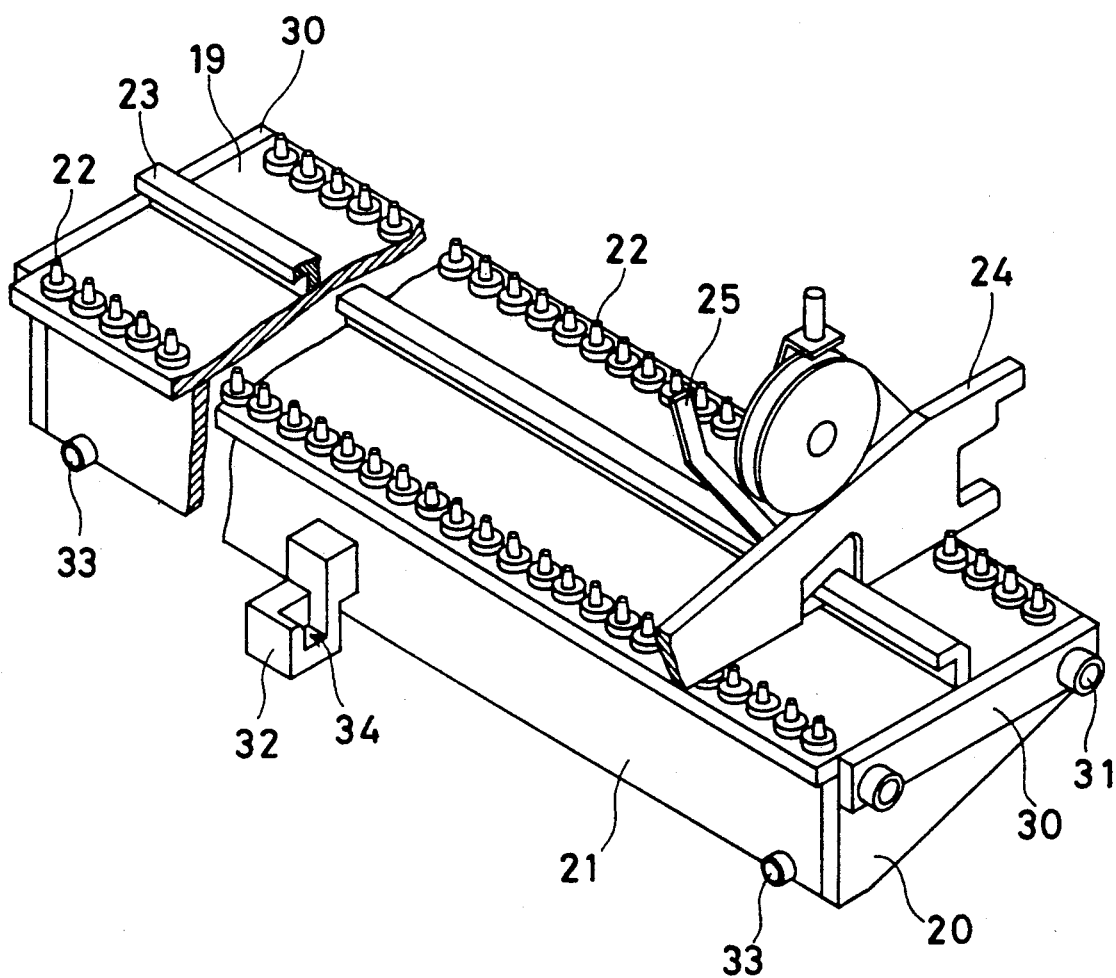

F I G. 14
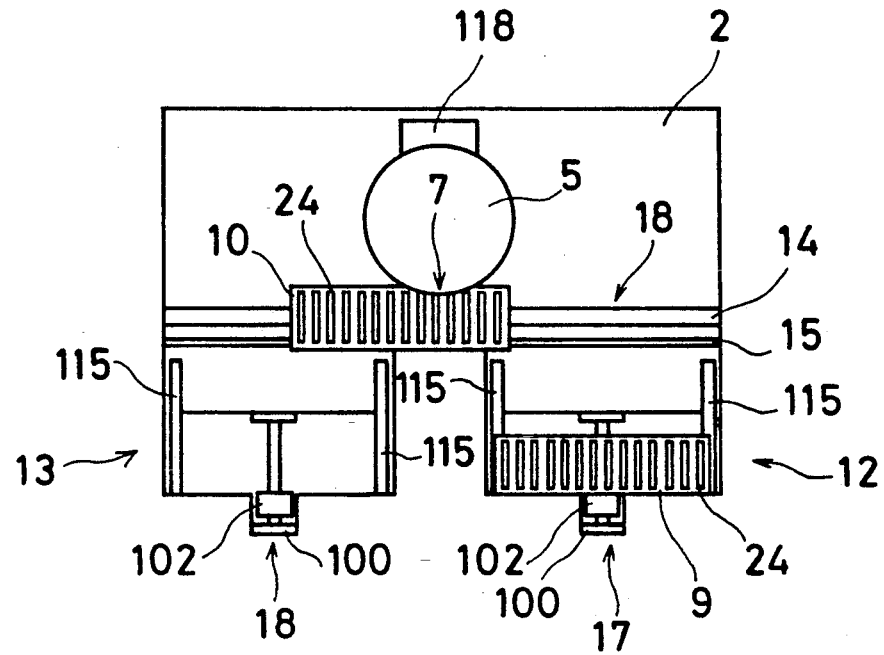
F I G. 15
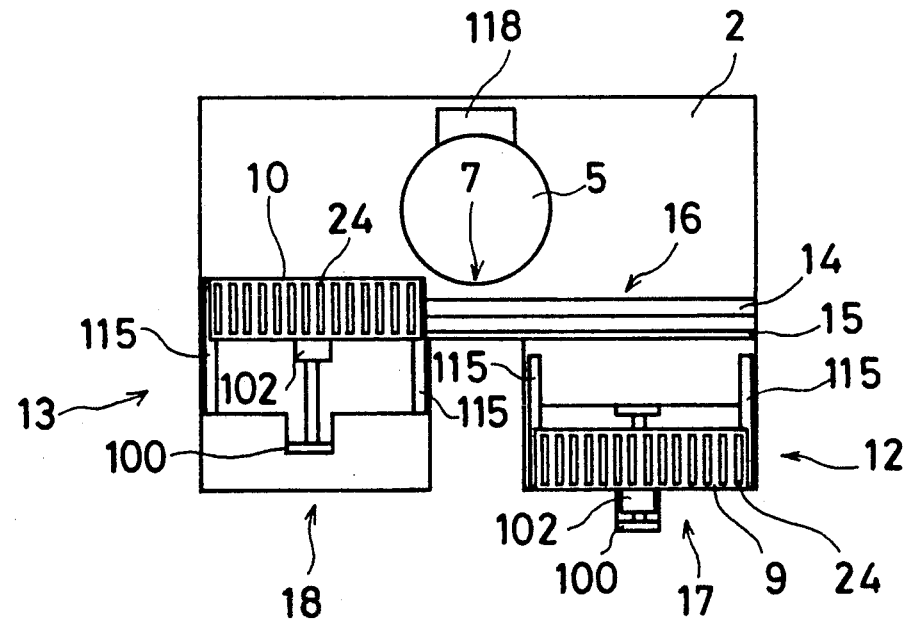

PARTS FEEDING APPARATUS

This application is a continuation of application Ser. No. 504,225 filed Apr. 4, 190, now abandoned.

BACKGROUND OF THE INVENTION

1. Field of the invention

The present invention relates to a parts feeding apparatus. More specifically, the present invention relates to apparatuses for feeding small-sized parts to a suction collet or the like.

2. Description of the Related Art

As an electronic parts feeding apparatus, an apparatus has been already well-known in which a plurality of parts dispensing units (parts cassettes) are arranged on a single parts feeding table and an arbitrary parts sending unit is placed in a parts taking-out position to feed parts by linearly moving the parts feeding table. In recent years, an apparatus comprising a plurality of parts feeding tables has been put into practice. An example of such an apparatus can be seen in Japanese Patent Laid-Open Gazette No. 63-269600.

This apparatus comprises two parts feeding tables and is so adapted that both the parts feeding tables are arranged on a track wherein a common working area is set at the center and standby areas are set on both sides thereof.

In the apparatus described in Japanese Patent Laid-Open Gazette No. 63-269600, since the standby areas are set on both sides of the working area, when combined with an electronic parts mounting apparatus, the standby areas are forced out of the electronic parts mounting apparatus, to make it difficult to connect the electronic part mounting apparatus to peripheral equipments.

In addition, in the apparatus described in Japanese Patent Laid-Open Gazette No. 63-269600, the standby areas are set on both sides of the working area, and one part feeding table is transferred to the working area to feed parts and the other parts feeding table is kept waiting in the standby areas. With respect to the parts feeding table in the standby area, the operator performs the supplementation of the parts, exchange of the parts cassette, or the like; however, since the standby areas are set on both sides of the working area, the parts feeding table in the working area is often closed to the parts feeding table in the standby area, and therefore, the operator must perform such a work with paying attention to the movement of the parts feeding table in the working area.

SUMMARY OF THE INVENTION

Therefore, a principal object of the present invention is to provide a novel parts feeding apparatus.

Another object of the present invention is to provide a parts feeding apparatus in which a standby area is set different from that in the conventional apparatus to reduce the entire width of the parts feeding apparatus.

The other object of the present invention is to provide a parts feeding apparatus in which an operator can perform any works safely.

In accordance with the present invention, a standby area is set in parallel with a working area. A table positioning unit for detachably loading a parts feeding table to place an arbitrary parts cassette on the parts feeding table in a parts taking-out position is arranged in the working area. Furthermore, there is provided a transport unit for unloading the parts feeding table from the table positioning unit to transport the same into the standby area or for transporting the parts feeding table from the standby area to load the same on the table positioning unit.

A parts feeding table which is not associated with the feed of parts is waiting in the standby area. A parts feeding table to be used is transferred to the working area from the standby area by the transport unit, to be connected to the table positioning unit. The table positioning unit is moved within the working area to place an arbitrary parts cassette on the parts feeding table in a parts taking-out position.

If there arises the necessity of replacing the parts feeding table with another parts feeding table, the table positioning unit delivers the parts feeding table to the above described transport unit, and the transport unit pulls the parts feeding table into the standby area. Alternately, another parts feeding table is transferred to the working area from the standby area, to be loaded on the table positioning unit, and thereafter, the table positioning unit places an arbitrary parts cassette in the parts taking-out position.

With respect to the parts feeding table in the standby area, the parts are supplemented or the parts cassette is exchanged during this waiting period.

In one aspect of the present invention, a table truck which is detachably loaded a parts feeding table and moved is arranged within a track of the parts feeding table, and a charge station is set in parallel with a standby area, and a table transport unit which transports only the parts feeding table between the charge station and the standby area.

In this case, if there arises the necessity of replacing the parts feeding table being used for feeding parts in the working area with another parts feeding table, the table truck is entered in the standby area. Alternately, another parts feeding table is led from the standby area to the working area, to start the feed of parts. The parts feeding table placed in the standby area is disconnected from the table truck to be transported to the charge station by the table transport unit. Thereafter, the parts are supplemented or the parts cassette is exchanged by the operator, the parts feeding table is transported to the standby area again by the transport unit, to be connected to the table truck so as to wait the next feed of parts.

In accordance with the present invention, since in the apparatus wherein a plurality of parts feeding tables are alternately used, a standby area for a parts feeding table which is not used is set in parallel with a working area, the standby area is not forced out of an end in the flowing direction of a printed circuit board within an electronic parts mounting apparatus. Consequently, the entire width of the electronic parts mounting apparatus can be reduced and the electronic parts mounting apparatus is easily connected to peripheral equipments.

Furthermore, in accordance with the present invention, since in the apparatus wherein a plurality of parts feeding table are alternately used, a charge station is set separately from a standby area so that the supplementation of the parts or the exchange of the parts cassette can be performed in the charge station, it becomes possible to perform such works safely without payment of attention to the movement of the parts feeding table which is being used in the working area.

The objects and other objects, features, aspects and advantages of the present invention will become more apparent from the following detailed description of the embodiments of the present invention when taken in conjunction with accompanying drawings.

BRIEF DESCRIPTION OF THE DRAWINGS

FIG. 1 is a front elevational view showing one example of a parts mounting apparatus which utilizes a parts feeding apparatus in accordance with one embodiment of the present invention.

FIGS. 2 and 3 are perspective views respectively showing a major portion of a parts feeding table of FIG. 1 embodiment.

FIGS. 5-10 are illustrative views showing a connecting mechanism for a table positioning unit of FIG. 1 embodiment, respectively, wherein FIGS. 5, 7 and 9 show one operation state, and FIGS. 6, 8 and 10 show another operation state.

FIGS. 14-18 are illustrative top plan views showing a series of operation of a parts feeding apparatus of FIG. 1 embodiment.

DETAIL DESCRIPTION OF THE PREFERRED EMBODIMENTS

Figure 3:
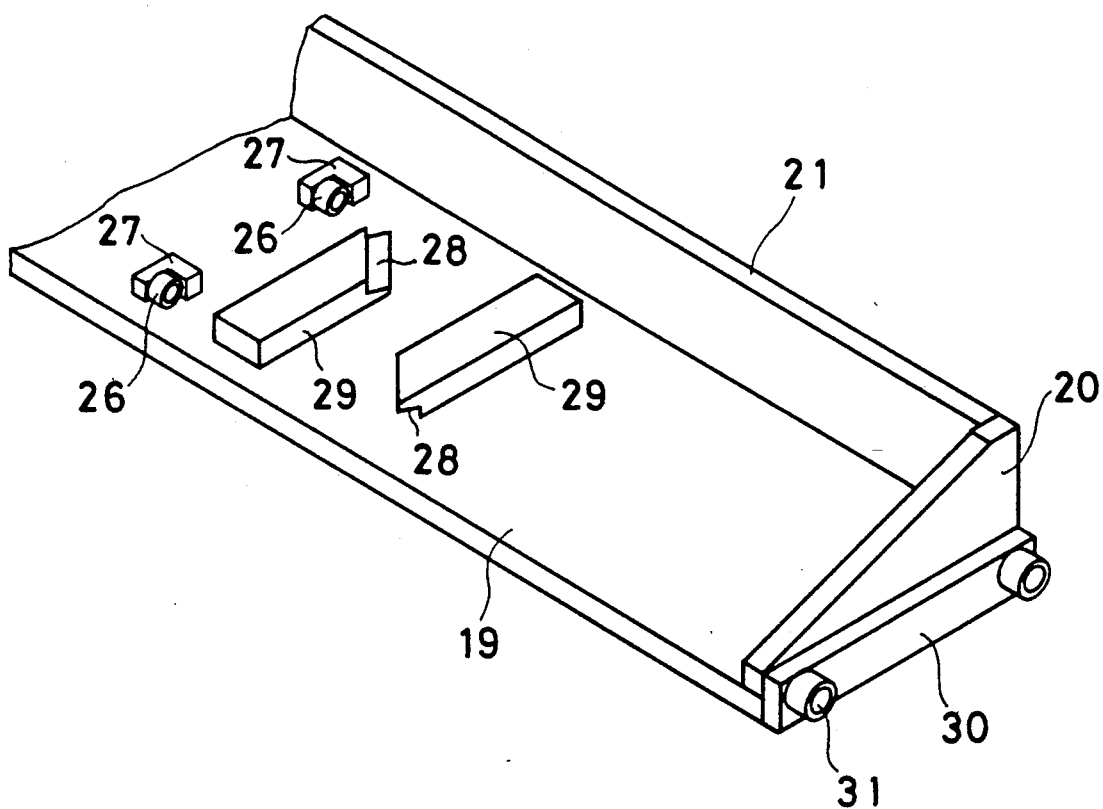

In FIG. 1, the reference numeral 1 designates an electronic parts mounting apparatus having an apparatus in accordance with the present invention located therein, the reference numeral 2 designates its main frame, the reference numeral 3 designates a picking-and-placing unit for mounting electronic parts on a printed circuit board, and the reference numeral 4 designates a parts feeding apparatus for feeding the electronic parts to the picking-and-placing unit 3. The schematic structure thereof is substantially the same as that described in, for example, Japanese Patent Laid-Open Gazette No. 63-177596.

In the picking-and-placing unit 3, a plurality of parts suction heads 6 movable up and down are arranged under the periphery of a rotary index table 5. The rotary index table 5 is dividable and rotatable only the number of times which is equal to the number of the parts suction heads 6. The rotary index table 5 is adapted to be lowered to take electronic parts out from a parts cassette as described later when it reaches a parts taking-out position 7 by the indexing and rotation thereof and is also lowered to mount the electronic parts on a printed circuit board (not shown) when it then reaches a parts mounting position in another station.

The parts feeding apparatus 4 includes a rail stand 8, parts feeding tables 9 and 10, a table positioning unit 11, and table transport units 12 and 13.

The rail stand 8 is fixed to the main frame 2. Rails 14 and 15 are laid on the rail stand 8 (see FIG. 5). The rail 14 constitutes a track of the parts feeding tables 9 and 10, and the whole region of the track is set as a working area 16 of the parts feeding tables 9 and 10. Standby areas 17 and 18 are set at both ends of the working area 16 to be parallel with the working area 16.

As shown in FIGS. 2 and 3, each of the parts feeding tables 9 and 10 includes a cassette supporting base 19 and reinforcing plates 20 and 21. A plurality of positioning pins 22 are arranged with constant intervals on both sides edges of the cassette supporting base 19. In addition, an angle 23 is arranged between the positioning pins 22. Parts cassette 24 can be attached to the parts feeding tables by rotating lever 25 in a clockwise direction aligning holes (not shown) of parts cassette 24 so that positioning pins 22 are fitted therein, and then returning lever 25 to the original position. Lever 25 then engages angle 23, thereby firmly attaching parts cassette 24. The parts cassette 24 has substantially the same structure as that described in Japanese Patent Laid-Open Gazette No. 63-98199.

The cassette supporting base 19 comprises on its lower surface a block 27 which supports a roller 26 and lock blocks 29 each of which has a stepped portion 28 at one end. Both the block 27 and the lock blocks 29 constitute a connecting member for the table positioning unit 11. The lock blocks 29 comprise a pair provided on the right and left sides. The stepped portions 28 on the right and left sides are opposite to each other in longitudinal direction and elevation. The surface of any one of the stepped portions 28 is inclined, the tip thereof being thin while the root thereof being thick.

Figure 11:
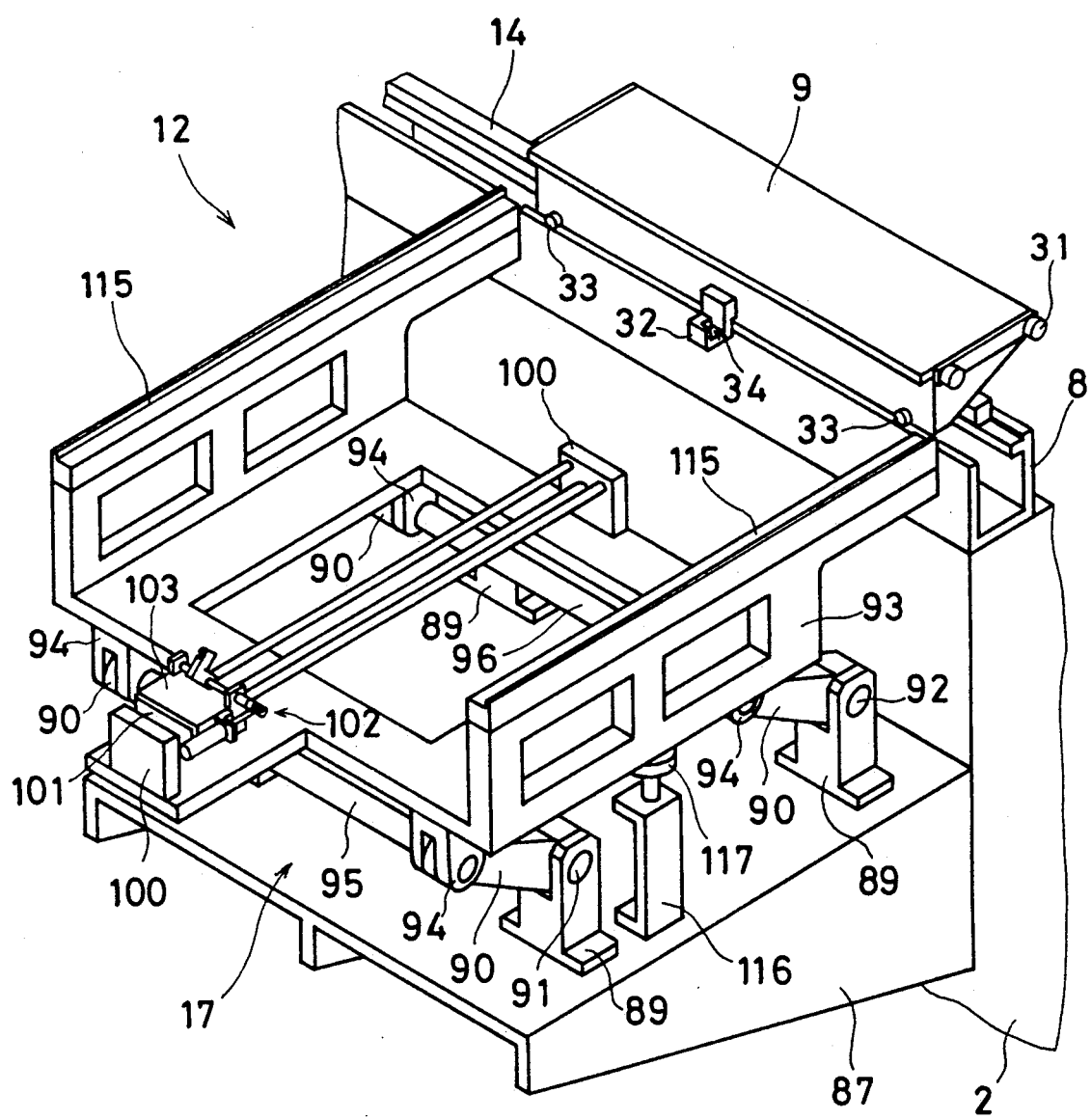
FIGS. 11 and 12 are perspective views respectively showing a major portion of a table transport unit of FIG. 1 embodiment and an operation state thereof.

Rollers 31 are attached to both end surfaces of the cassette supporting base 19 through a bracket 30. A connecting block 32 is fixed at the center of an outer side surface of the reinforcing plate 21, and rollers 33 are mounted in the vicinities of both lower ends thereof. The connecting block 32 has a concave portion 34 to which a table tractive member 102 (FIGS. 11 and 12) as described later is connected. The rollers 33 are connected to the table positioning unit 11 and then, abut on the upper surface of the rail 15, to prevent the parts feeding tables 9 and 10 from being inclined due to the weight of the parts cassette 24.

As shown in FIGS. 4 to 10, the table positioning unit 11 includes a box 35. The box 35 comprises a combination of an upper plate 36, a pair of side plates 37, and a bottom plate 38 in the form of a box opened at both ends thereof. The bottom plate 38 is held in a slider 39 slidable on the rail 14 and is movable along the rail 14 and thus the working area 16.

The reference numeral 41 designates a block having its upper end fixed to the bottom plate 38 and having a nut 40 fitted in its lower portion. A lead screw 43 supported by bearing blocks 42 (only one is shown) in the vicinities of both ends thereof is threaded into the nut 40. The pulley 44 is attached to one end of the lead screw 43, to be connected to a pulley of a drive motor (not shown) by a belt 45. Consequently, the rotation of the drive motor is transferred to the lead screw 43, thereby allowing the box 35 to be moved.

A pair of wide grooves 46 and a pair of narrow grooves 47 are formed on the upper surface of the upper plate 36. Bearings 48 are respectively fitted in the central portions of the grooves 46 which sandwich the grooves 47 therebetween. Each of the bearings 48 is paired with each of bearings 49 fitted in the bottom plate 38, to support a supporting shaft 51 in such a shape that a bevel gear 50 is interposed therebetween. The bevel gear 50 is fixed to the supporting shaft 51. The upper portion of the supporting shaft 51 is projected into the groove 46, and a rotor blade-type clamper 52 is fitted to the upper end of the shaft 51. A key 53 prevents the clamper 52 from being rotated about the supporting shaft 51. Inclined surfaces 54 which engage with the stepped portions 28 of the above described lock blocks 29 are formed in both blade portions of the clamper 52. One end of a lever 55 is fitted in a boss portion of the bevel gear 50 and is fixed thereto. The other end of the lever 55 becomes a yoke portion 56 into which a roller 57 is fitted. The roller 57 is attached to a slide rod 58. The slide rod 58 is supported by two bearing blocks 59 provided spaced apart from each other in the innermost part of the box 35 and bearing blocks 60 mounted in the vicinities of both openings of the box 35 (only one of the bearing blocks 60 is shown) such that it can slide parallel with the direction of movement of the box 35.

Figure 7:
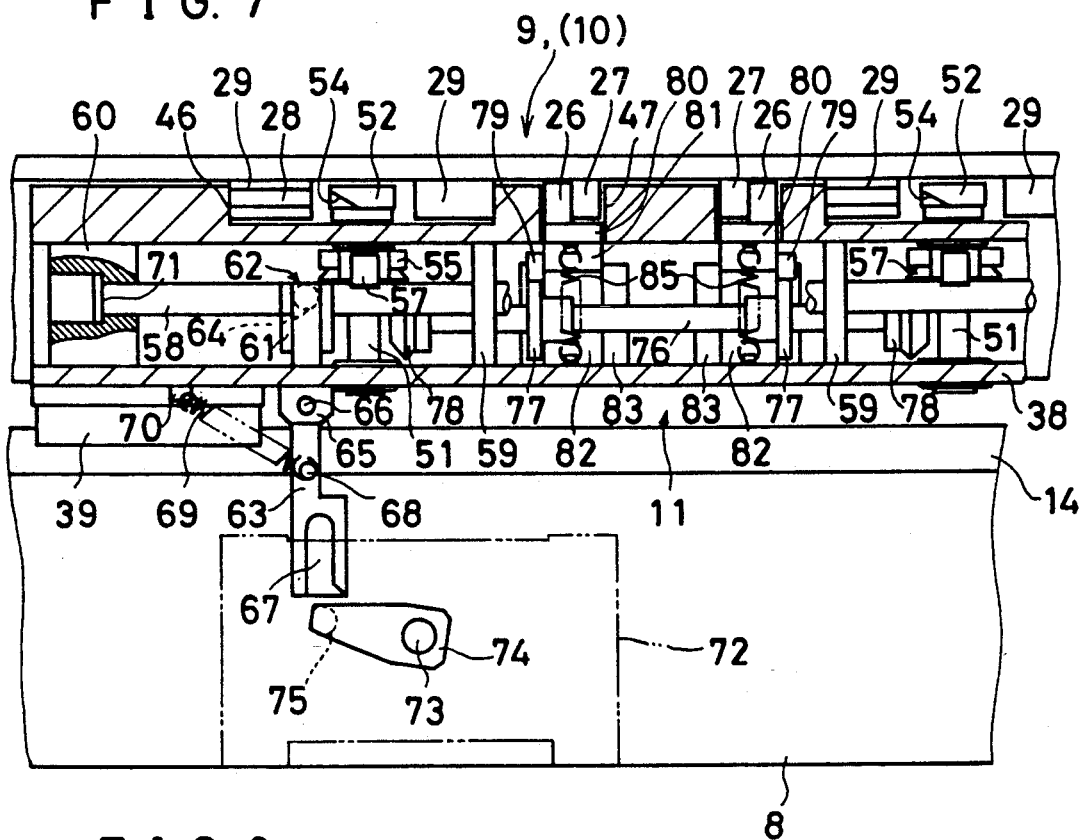
Figure 8:
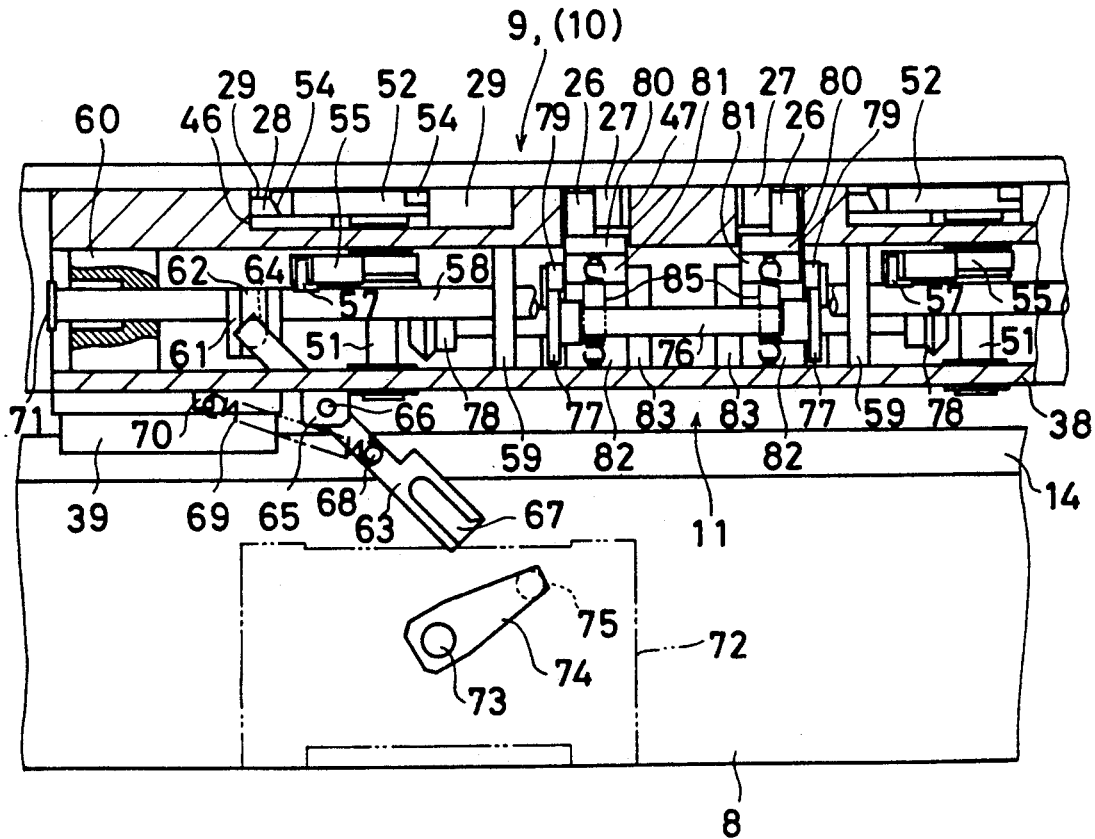

In FIGS. 7 and 8, a disk 61 is mounted on the left side of a portion where the roller 57 is mounted of the slide rod 58. A roller 64 attached to the upper portion of a lever 63 which is rotatably supported on the bottom plate 38 is fitted in the outer periphery 62 of the disk 61. The reference numeral 65 designates a block mounted on the lower surface of the bottom plate 38 to support the lever 63. A pin 66 penetrates the lever 63 and the block 65, whereby the lever 63 is rotatable about the pin 66 serving as a fulcrum. A yoke portion 67 is configured at the end of the lever 63. A pin 68 is projected above the yoke portion 67. One end of a coil spring 69 is connected to the pin 68. The other end of the coil spring 69 is connected to a block 70 mounted on the lower surface of the bottom plate 38, to urge the lever 63 in a clockwise direction. The reference numeral 71 designates a washer attached to one end of the slide rod 58, which is used for preventing the lever 63 from sliding the slide rod 58 to the right beyond a constant place in FIG. 7 by the urging force of the coil spring 69.

The reference numeral 72 designates a rotary actuator arranged outside of the rail stand 8, in which an arm 74 is fixed to an axis 73 of rotation. A roller 75 is mounted on the arm 74. If the arm 74 is rotated, the roller 75 enters the yoke portion 67 of the lever 73, to rotate the lever 63. Two rotary actuators 72 are arranged in the vicinities of both ends of the working area 16.

The reference numeral 76 designates a cam shaft which together with the slide rod 58, is supported on the bearing block 59. Bevel gears 78 engaged with the bevel gears 50 are attached to both ends of the cam shaft 76. Consequently, if the supporting shaft 51 is rotated, the cam shaft 76 is also rotated. Two plate cams 77 are fixed to the cam shaft 76. Each of the plate cams 77 is located between the grooves 46 and 47, and a roller 79 is in contact with the outer peripheral surface of the cam 77. The roller 79 is mounted at the center of the lower surface of an up-and-down base 80 fitted in the groove 47 through a block 81. Sliders 82 are mounted in the vicinities of both ends of the lower surface of the up-and-down base 80. The sliders 82 are interposed between a pair of guide rails 83 fixed to the pair of side plates 37 and are used for guiding an up-and-down movement of the up-and-down base 80. The reference numeral 84 designates a block fixed to the up-and-down base 80, to which one end of a coil spring 85 is connected. The other end of the coil spring 85 is connected to a block 86 attached to the bottom plate 38. Accordingly, the roller 79 is always pressed against the plate cam 77 (see FIG. 9).

The parts feeding table 9 or 10 is connected to the table positioning unit 11 in the following manner.

Figure 5:
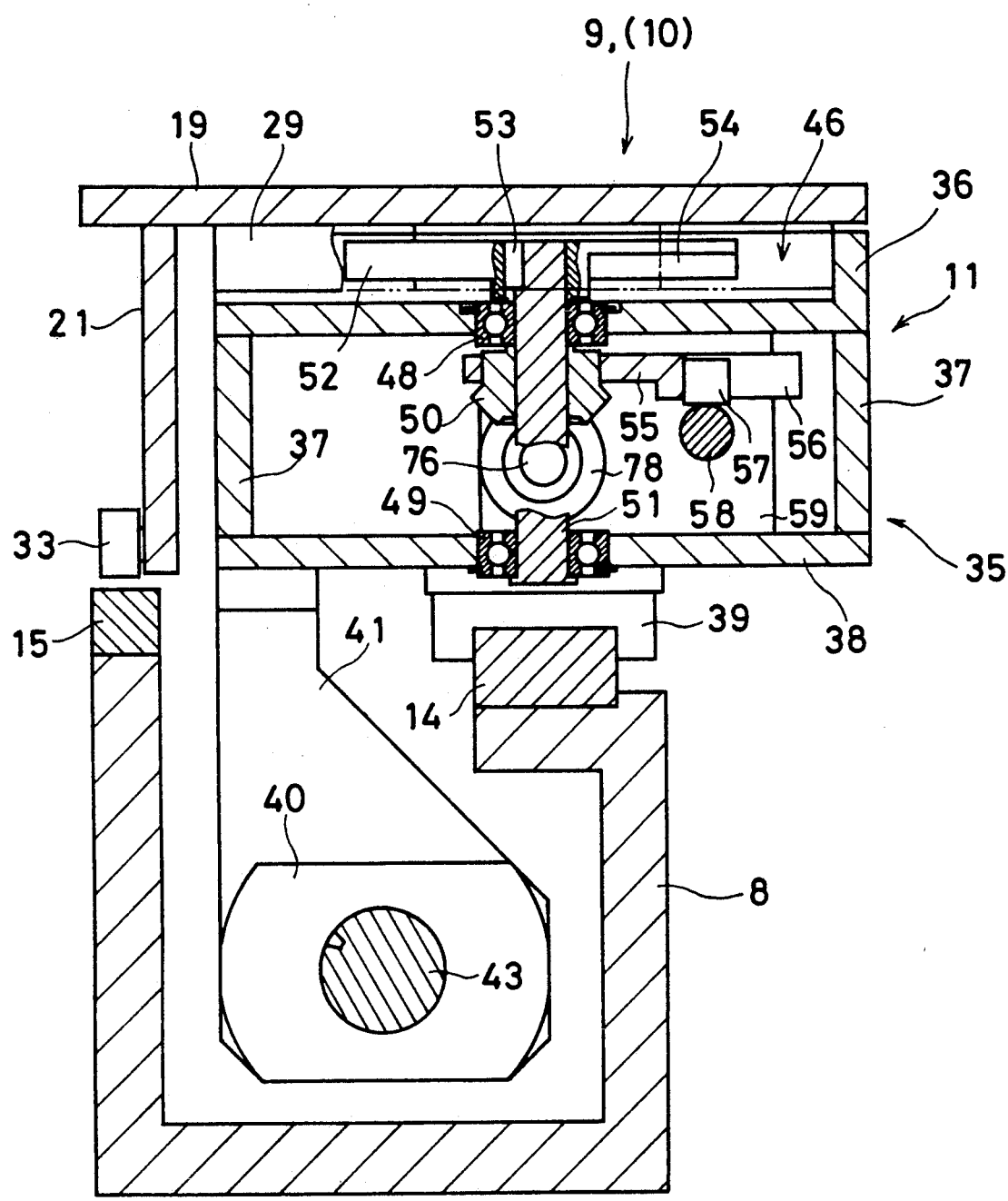
Figure 6:
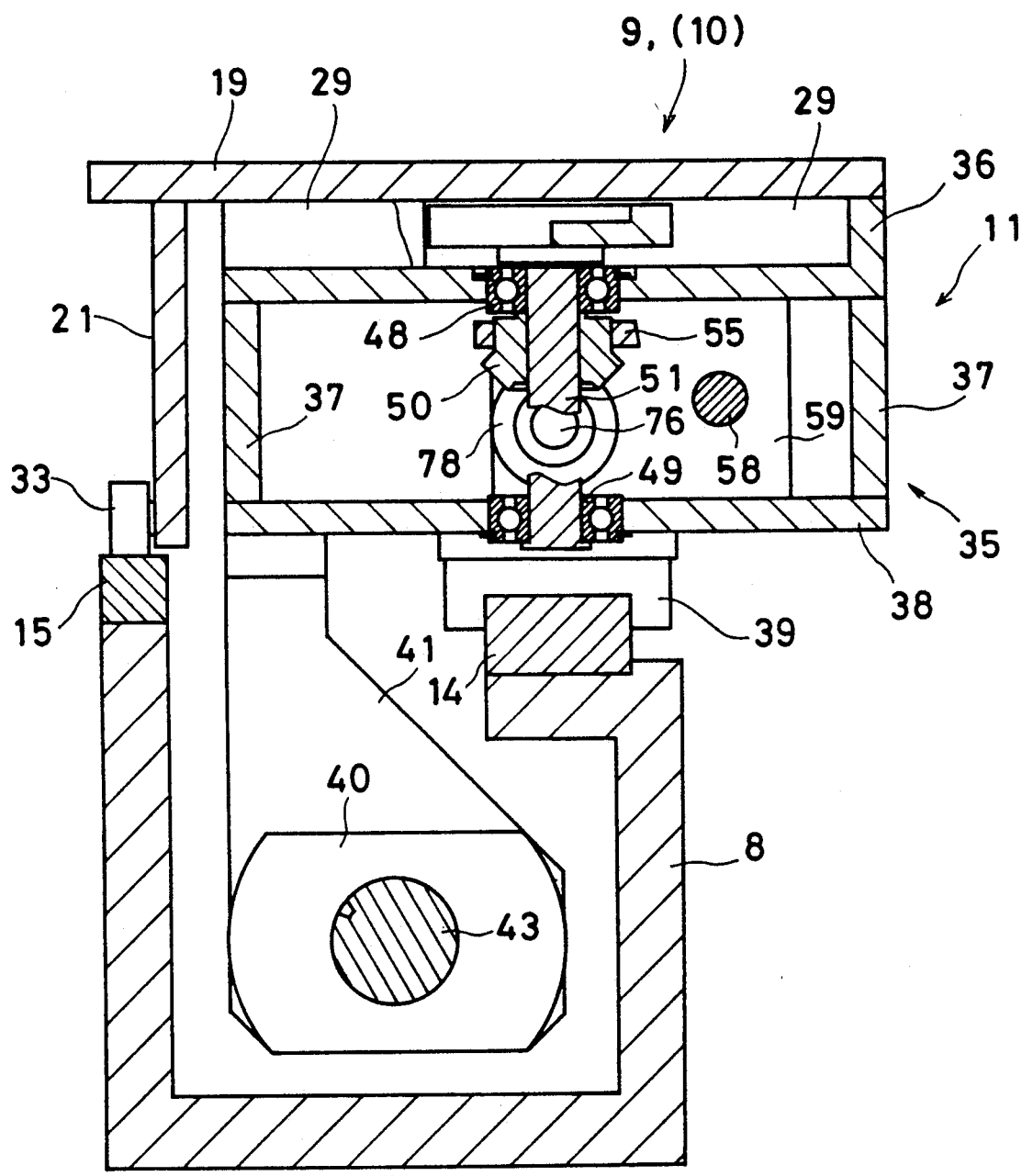
Figure 9:
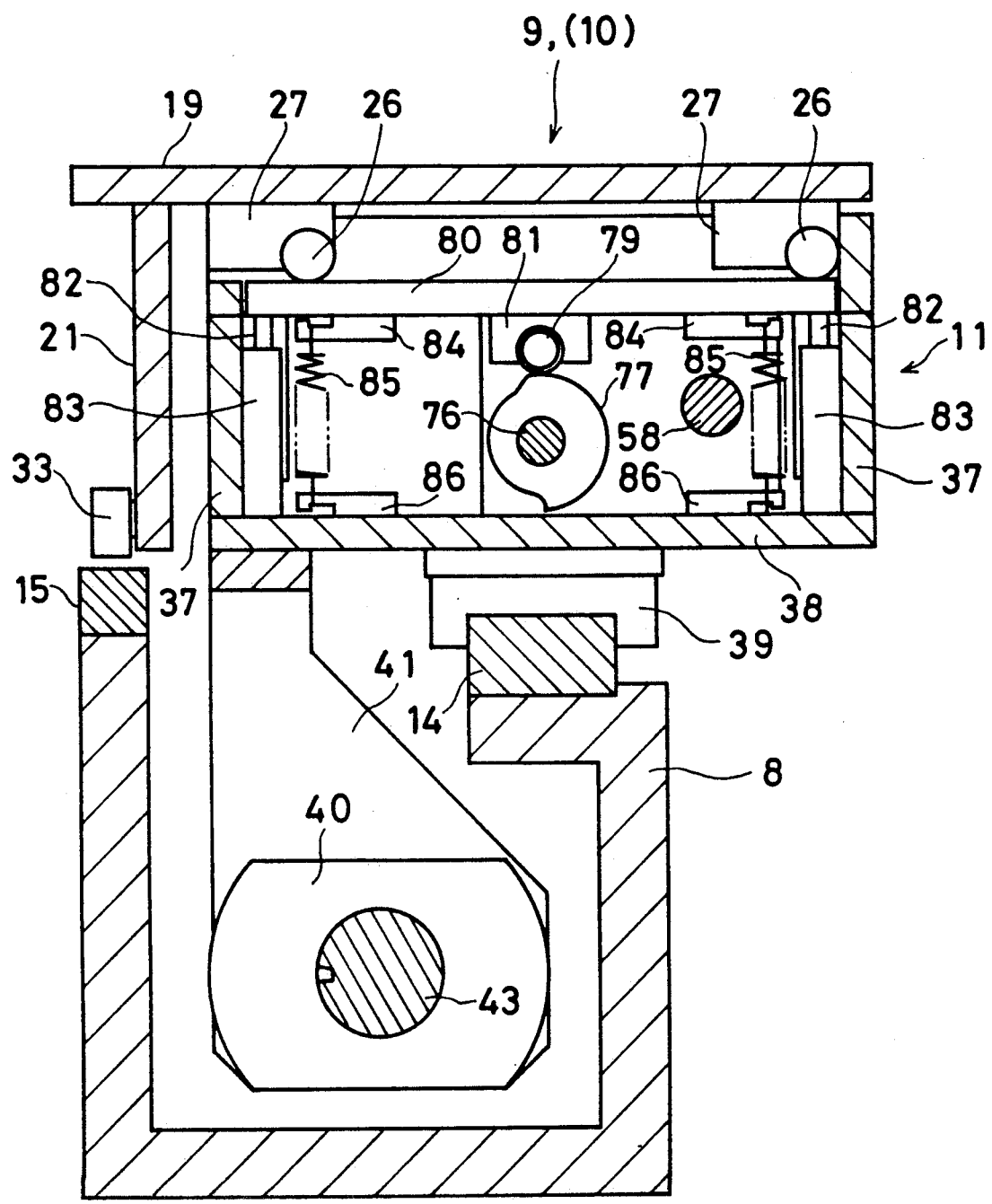
Figure 10:
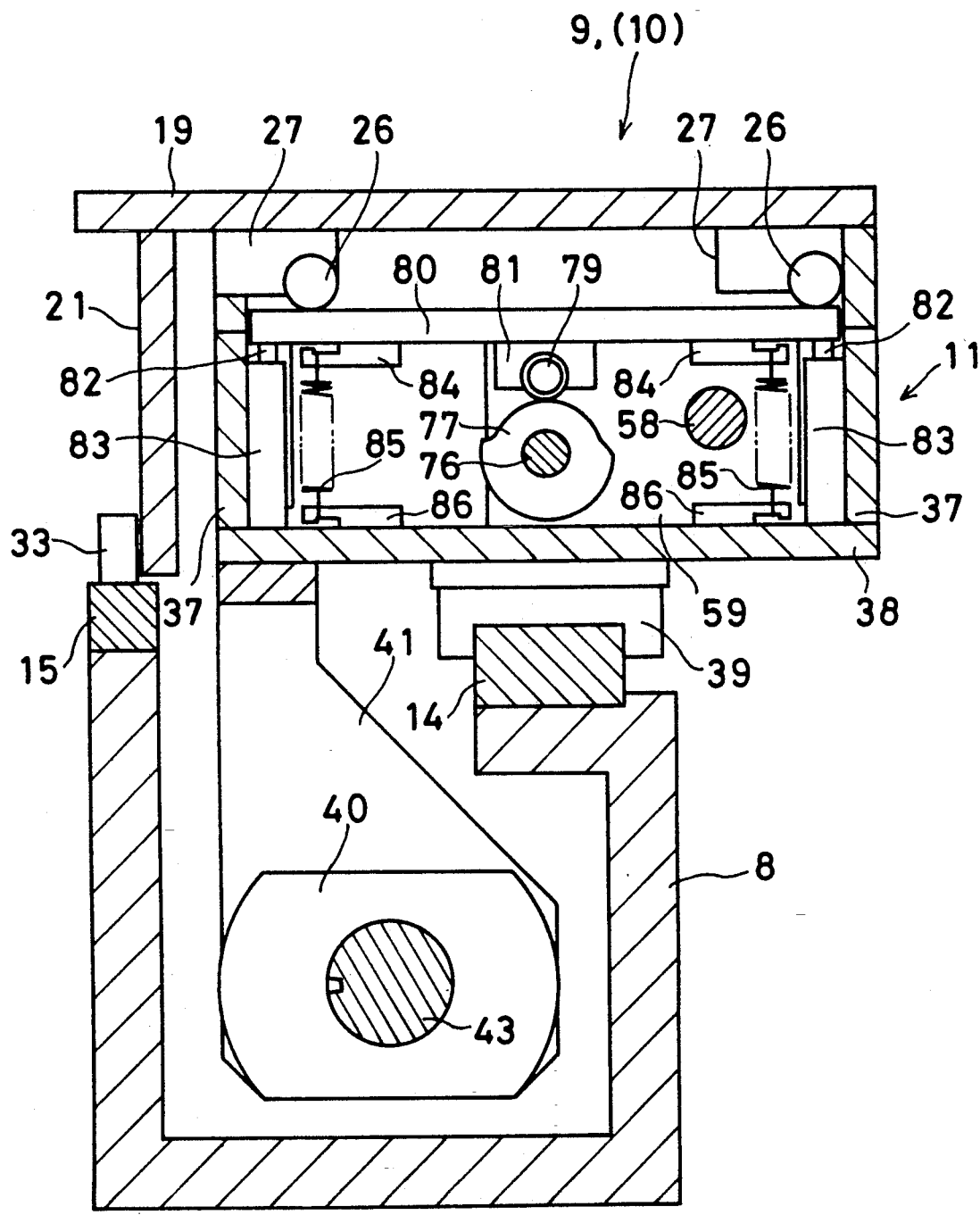

When the parts feeding table 9 or 10 is to be transferred by the table transport unit 12 or 13, the table positioning unit 11 is waiting for the parts feeding table 9 or 10 at either one of the both ends of the working area in a state shown in FIGS. 5, 7 and 9. For convenience, description is now made assuming that the table transport unit 12 transfers the parts feeding table 9 to the table positioning unit 11.

On this occasion, the lever 63 is drawn up to the position shown in FIG. 7 by the coil spring 69. Accordingly, the slide rod 58 is shifted to the right in FIG. 7. The roller 57 on the slide rod 58 maintains the clamper 52 at a right angle to the direction of movement of the table positioning unit 11. The cam shaft 76 connected to the supporting shaft 51 pushes up the up-and-down base 80 by the plate cam 77 at this time. The parts feeding table 9 enters this place. The roller 26 is caused to run onto the up-and-down base 80 in its raised position. The parts feeding table 9 covers the table positioning unit 11 with the lower surface thereof not being in contact with the table positioning unit 11.

At this time, the lock blocks 29 enter the groove 46 in such a manner that the clamper 52 is sandwiched therebetween. When the parts feeding table 9 is completely overlapped with the table positioning unit 11, the rotary actuator 72 begins to rotate the arm 74. The arm 74 is rotated in a clockwise direction in FIG. 7 to cause the roller 75 to enter the yoke portion 67 of the lever 63, thereby to rotate the lever 63 in a counterclockwise direction against the coil spring 69. Consequently, the slide rod 58 is shifted to the left shown in FIG. 7. Accordingly, the supporting shaft 51 is rotated in a clockwise direction as viewed from above. The clamper 52, together with the supporting shaft 51, is also rotated. One of the blade portions of the clamper 52 is engaged with the lock block 29 having the stepped portion 28 inclined upward to pull the same downward, while the other blade portion thereof is engaged with the lock block 29 having the stepped portion 28 inclined downward to pull the same upward. As a result, the parts feeding table 9 is fixed without being shaky. Furthermore, at the same time, the cam shaft 76 is rotated, to lower the up-and-down base 80 to its lowered position, thereby to seat the parts feeding table 9 on the table positioning unit 11. This results in a state shown in FIGS. 6, 8 and 10.

The rotary actuator 72 continues to rotate the arm 74 until the roller 75 is pulled out of the yoke portion 67. After the arm 74 is detached from the yoke portion 67, however, the slide rod 58 continues to be held in the position shown in FIG. 8 by the friction between the lock block 29 and the clamper 52. In order to reliably prevent the slide rod 58 from being returned, a suitable click device constituted by a ball and a spring may be provided for the clamper 52 or the slide rod 58 itself. The arm 74 is waiting at an angle shown in FIG. 8 until the table positioning unit 11 is returned to unload the parts feeding table 9. If the table positioning unit 11 is returned, the arm 74 starts to be rotated in a counterclockwise direction. The arm 74 is engaged with the lever 63, to return a connecting mechanism to the state shown in FIGS. 5, 7 and 9.

Each of the table transport units 12 and 13 is constructed on each of a pair of right and left mounting base 87 and 88 projected on this side of the main frame 2. The table transport units 12 and 13 have the same structure and hence, description is made on the table transport unit 12 herein.

In the table transport unit 12, one end of each of links 90 is rotatably supported on each of four blocks 89 mounted on the upper surface of the mounting base 88. Connecting shafts 91 and 92 penetrate both the blocks 89 arranged in parallel with the rail stand 8 so as, to connect the links 90 to the blocks 89, respectively. Another end of each of the links 90 is fitted in a block 94 mounted on the lower surface of a rail base 93. The connection is made by connecting shafts 95 and 96 in the above described manner. The connecting shaft 92 is in a fixed relation to the link 90, and a lever 97 is fixed in the vicinity of the center thereof. A knuckle joint 99 of an air cylinder 98 arranged on the mounting base 88 is connected to a top end of the lever 97. If the air cylinder 98 causes a rod to project or retract, the links 90 change its angle. Accordingly, the rail base 93 is moved in parallel from its lowered position (see FIG. 11) to its raised position (see FIG. 12), or vice versa. The reference numeral 100 designates a rodless air cylinder mounted on the rail base 93. The reference numeral 101 designates a slider of the rodless air cylinder 100, to which a base 103 of a table tractive member 102 is fixed. A pair of bearing blocks 104 are projected from the base 103 as shown in FIG. 13. The bearing blocks 104 support an axis 107 of rotation to which a clamper 106 having a roller 105 at its top end is fixed.

A lever 109 having a long hole 108 is fixed at one end of the axis 107 of rotation. An air cylinder 111 is mounted on a perpendicular surface of the base 103 through a cylinder bracket 110. In addition, a pusher rod 113 is mounted on a rod 112 of the air cylinder 111. A roller 114 is attached on the pusher rod 113. The roller 114 is fitted in the long hole 108 of the lever 109. Consequently, the clamper 106 assumes a disconnected position in which the roller 105 is unfitted from the concave portion 34 of the connecting block 32 fixed to the parts feeding table 9 or 10 if the air cylinder 111 pushes the rod 112 out of it, while assuming a connected position in which the roller 105 is fitted in the concave portion 34 if the air cylinder 111 pulls the rod 112 in it.

The reference numeral 115 designates rails laid at an upper end of a rising portion of a side edge of the rail base 93 and constituting a moving path of the parts feeding table 9. A standby area 17 of the parts feeding table 9 is set on this side of the rails 115 when the rail base 93 is in its lowered position. With respect to the table transport unit 13, the above described standby area 18 is set. The reference numeral 116 designates a stopper stand fixed to the mounting base 88, which has an adjuster bolt 117 fitted at its upper end and is used for determining the lower limit of the rail base 93.

Description will be made on an operation of the table transport unit 12.

If the parts feeding table 9 reaches one end of the working area 16 so as to be replaced with another parts feeding table and the connection between the parts feeding table 9 and the table positioning unit 11 is released, the rail base 93 is lifted up by the air cylinder 98. When the rail base 93 reaches its raised position, the roller 31 in the parts feeding table 9 runs onto the rail 115 (and at this time, the parts feeding table 9 comes up to the surface of the table positioning unit 11 by the up-and-down base 80). The clamper 106 of the table tractive member 102 is connected to the connecting block 32 in the parts feeding table 9 (see FIG. 12). The table tractive member 102 then pulls the parts feeding table 9 into the direction of the termination of the rail 115. Subsequently, the rail base 93 is moved to its lowered position, and the parts feeding table 9 reaches the standby area 17.

The work of replacing a parts cassette in the standby area 17 is performed with the parts feeding table 9 being held by the table tractive member 102. However, if the connection between the table tractive member 102 and the parts feeding table 9 can be released by depressing a switch (not shown), the parts feeding table 9 can be replaced as a whole.

Figure 12:
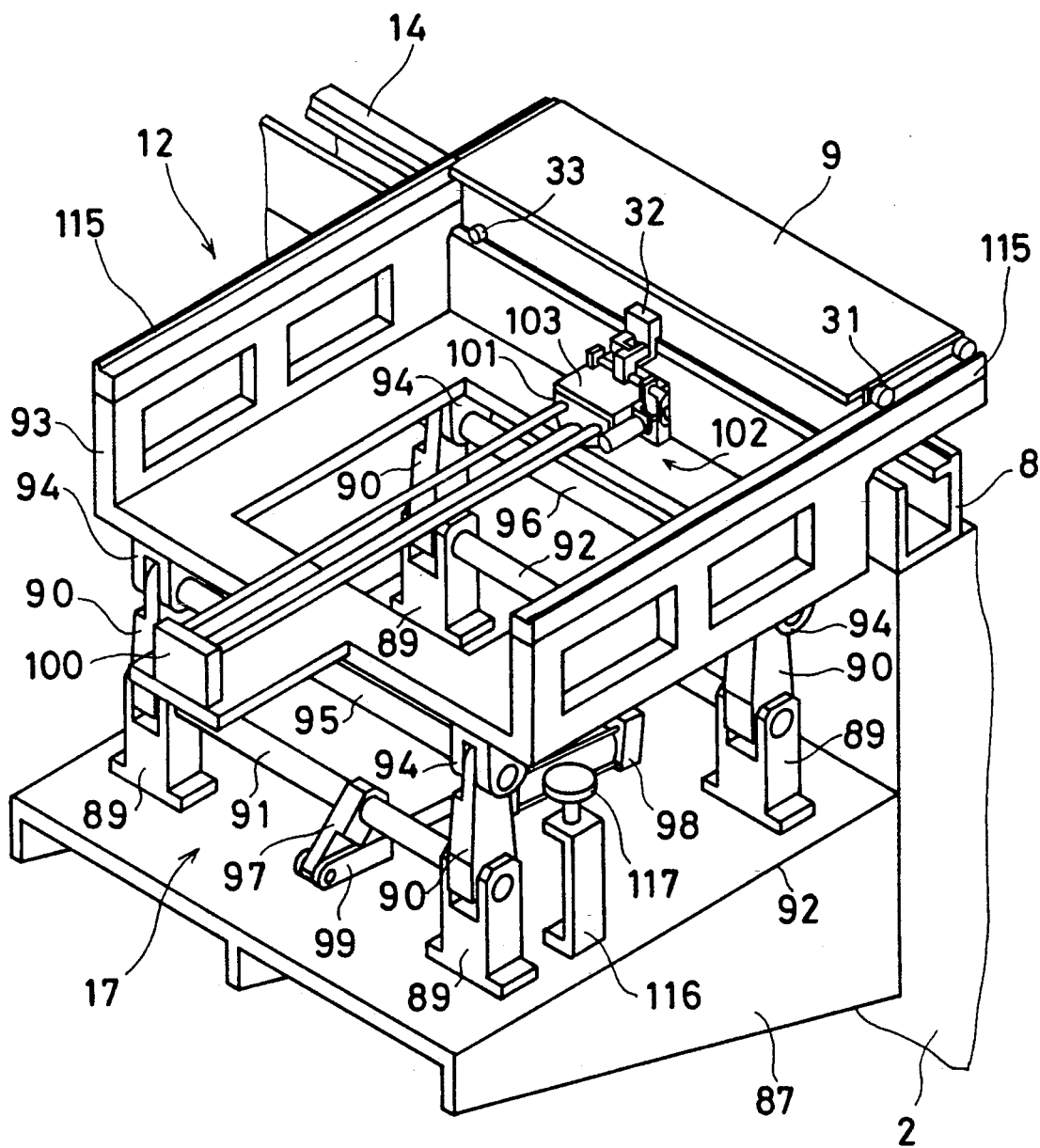
Figure 13:
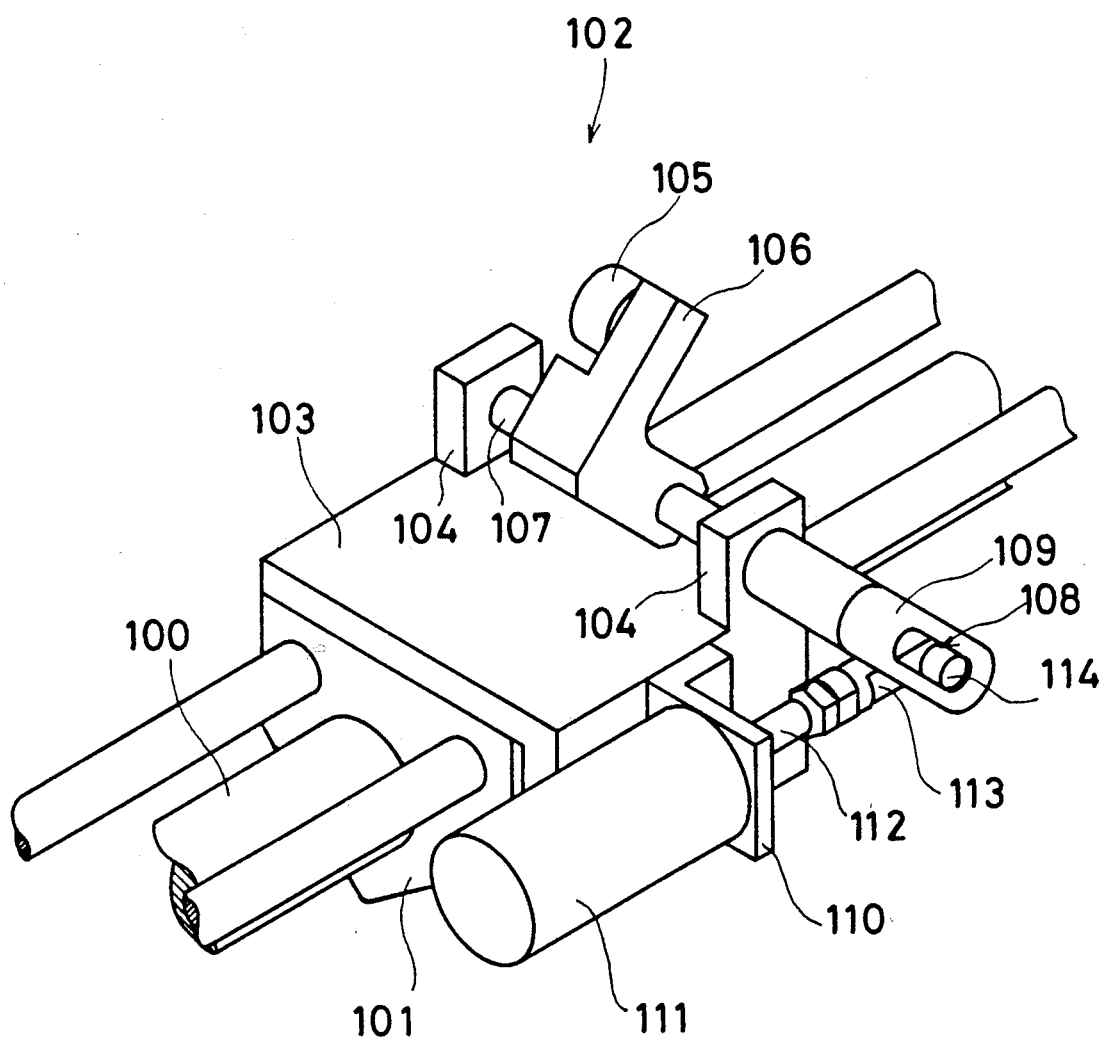
FIG. 13 is a perspective view showing a table tractive member of FIG. 1 embodiment.

When the parts feeding table 9 is to be delivered to the table positioning unit 11, the rail base 93 is first moved to its raised position, and the table tractive member 102 transports the parts feeding table 9 onto the table positioning unit 11 (see FIG. 12). Thereafter, the table tractive member 102 is moved backward after being disconnected from the connecting block 32, and the rail base 93 is moved to its lowered position (see FIG. 11).

Description is now made on a series of operations of the parts feeding apparatus 4 with reference to FIGS. 14 to 18. In FIGS. 14 to 18, the reference numeral 118 designates an X-Y table supporting a printed circuit board.

In the state shown in FIG. 14, a parts feeding table 9 which is not associated with the feed of parts is waiting in the standby area 17. A parts feeding table 10 to be used is transferred to the working area 16 from the standby area 18 by the table transport unit 13, to be supported on the table positioning unit 11. The table positioning unit 11 is moved throughout the working area 16 to place an arbitrary parts cassette 24 on the parts feeding table 10 in a parts taking-out position 7.

If there arises the necessity of replacing the parts feeding table 10 with the parts feeding table 9 in the standby area 17, the table positioning unit 11 is moved to a position aligned with the table transport unit 13, to deliver the parts feeding table 10 to the table transport unit 13 (see FIG. 15).

Figure 16:
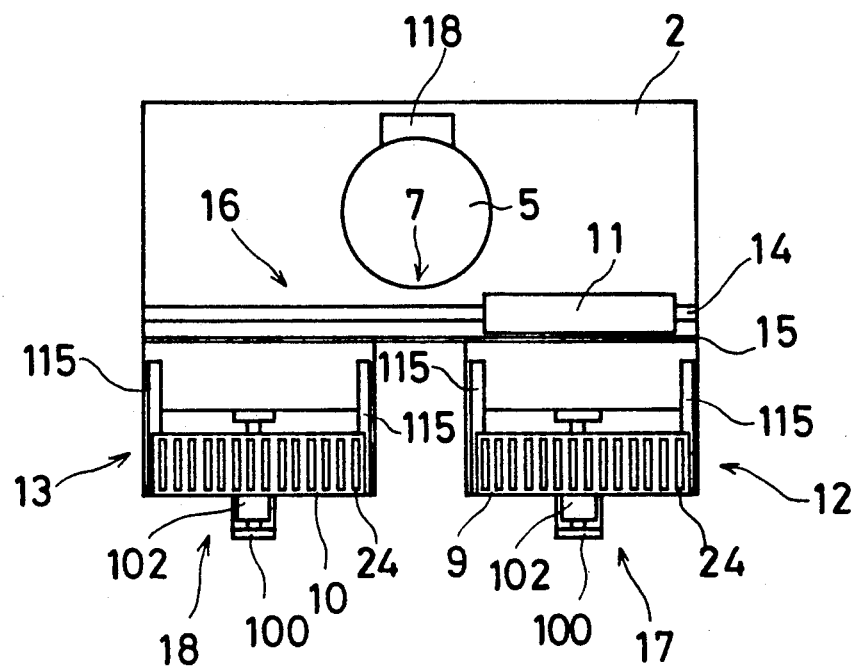
Figure 17:
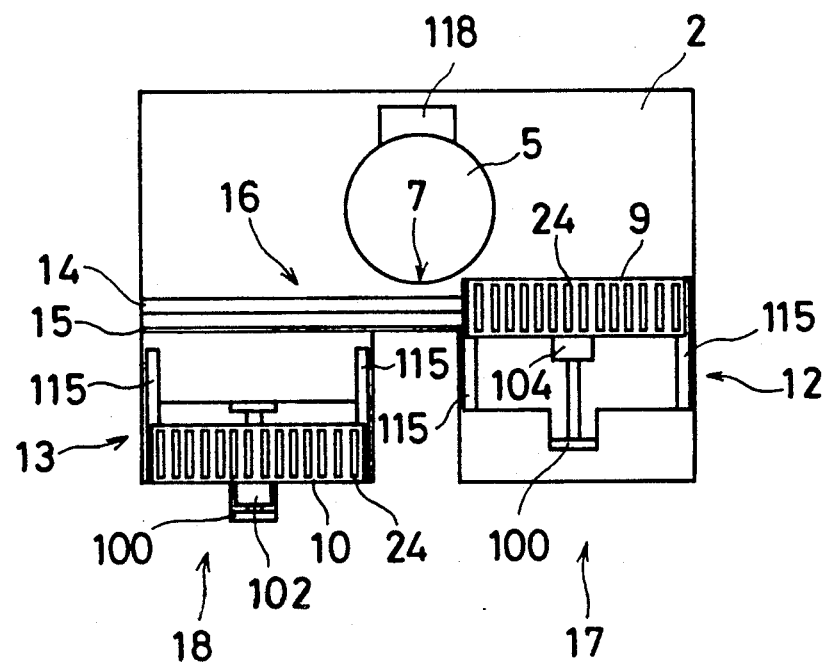

The table transport unit 13 pulls the parts feeding table 10 into the standby area 18, and the table positioning unit 11 is moved to a position opposed to the table transport unit 12 so as to pull the parts feeding table 9 in it (see FIG. 16).

Figure 18:
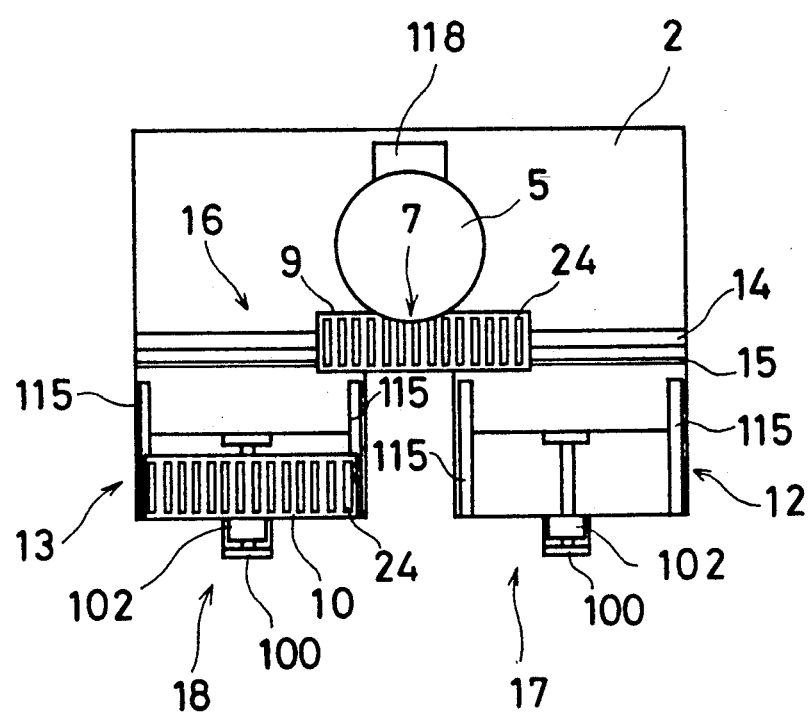

Thereafter, the table transport unit 12 transports the parts feeding table 9 into the working area 16 (see FIG. 17), and the table positioning unit 11 is connected to the parts feeding table 9 to place the arbitrary parts cassette 24 in the parts taking-out position 7 (see FIG. 18).

With respect to the parts feeding table 10 in the standby area 17 or 18, during the waiting period, the parts are supplemented, or the parts cassette 24 is exchanged, or the parts feeding table 10 itself is replaced. Therefore, in FIG. 1 embodiment, each of the standby areas 17 and 18 is also used as a charge station.

Figure 19:
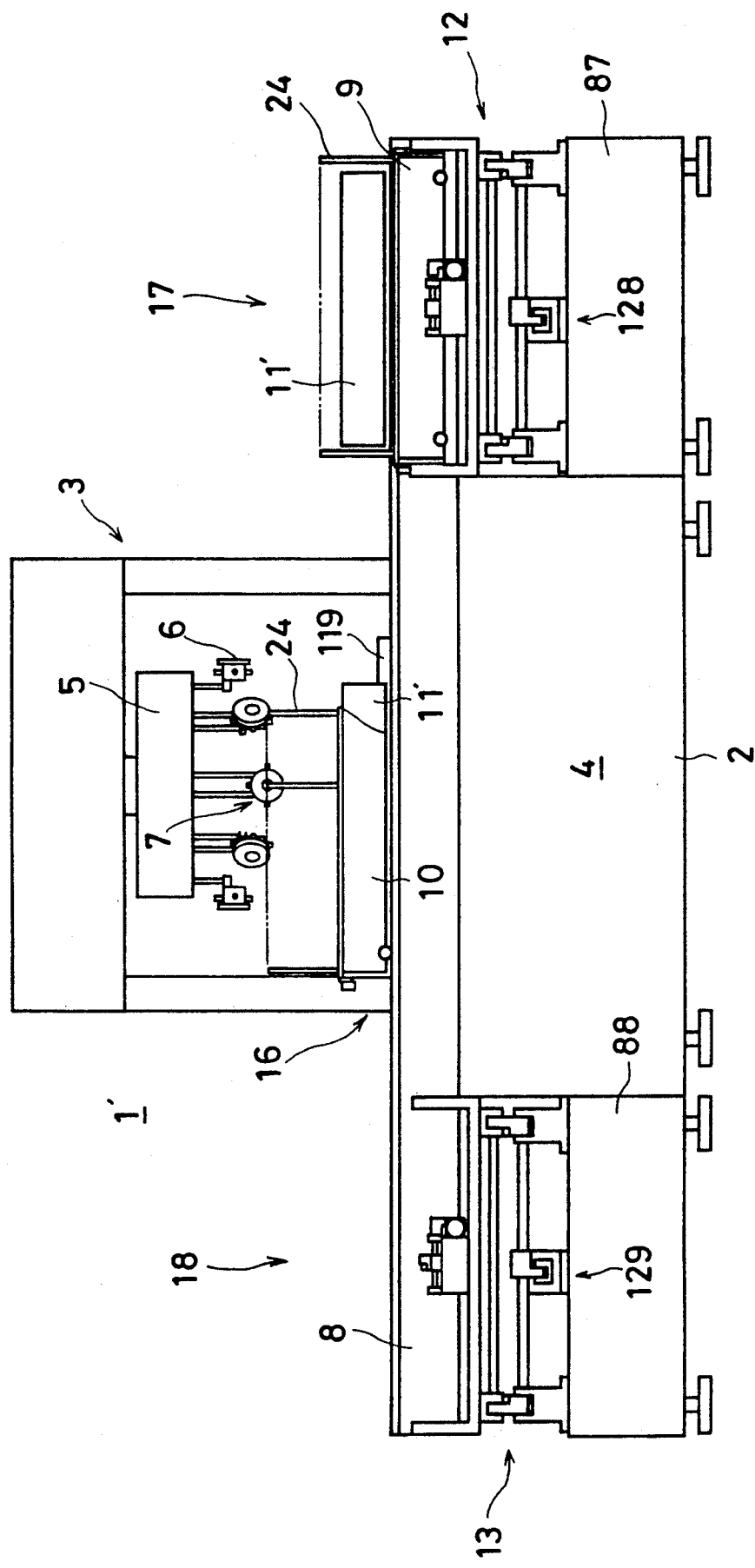
FIG. 19 is a front elevational view showing one example of parts mounting apparatus which utilizes a parts feeding apparatus in accordance with the other embodiment of the present invention.

FIG. 19 is a front elevational view showing a parts mounting apparatus utilizing a parts feeding apparatus in accordance with the other embodiment of the present invention. In a parts mounting apparatus 1' of this embodiment shown, instead of the table positioning unit 11 of FIG. 1 embodiment, table trucks 11' having similar function thereto are utilized. Although each of the table trucks 11' does not have wheels, for convenience, the same is called as a table truck because it is moved with the parts feeding table 9 or 10 being laid thereon. The table trucks 11' are moved between the working area 16 and the standby area 17 or 18 by a tractive member 119.

The standby areas 17 and 18 are arranged at the both ends of the working area 16 to be in parallel therewith; however, in FIG. 19 embodiment, the standby areas 17 and 18 are arranged at the both ends of the working area 16 to be in series therewith and charge stations 128 and 129 are arranged to be in parallel with the standby areas 17 and 18 as shown in FIGS. 23 to 26.

Figure 4:
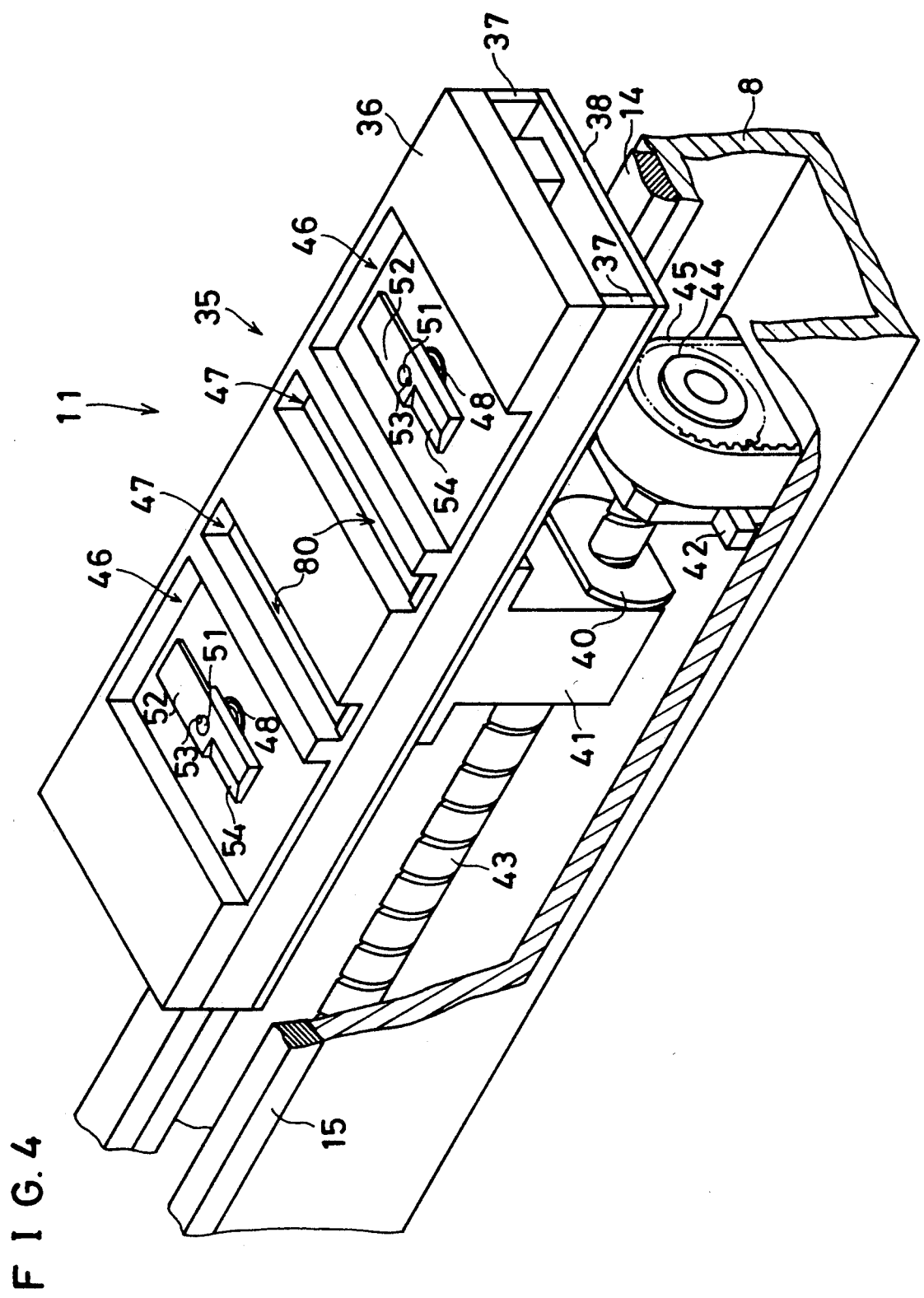
FIG. 4 is a partially cut-away perspective view showing a major portion of a table positioning unit of FIG. 1 embodiment.
Figure 20:
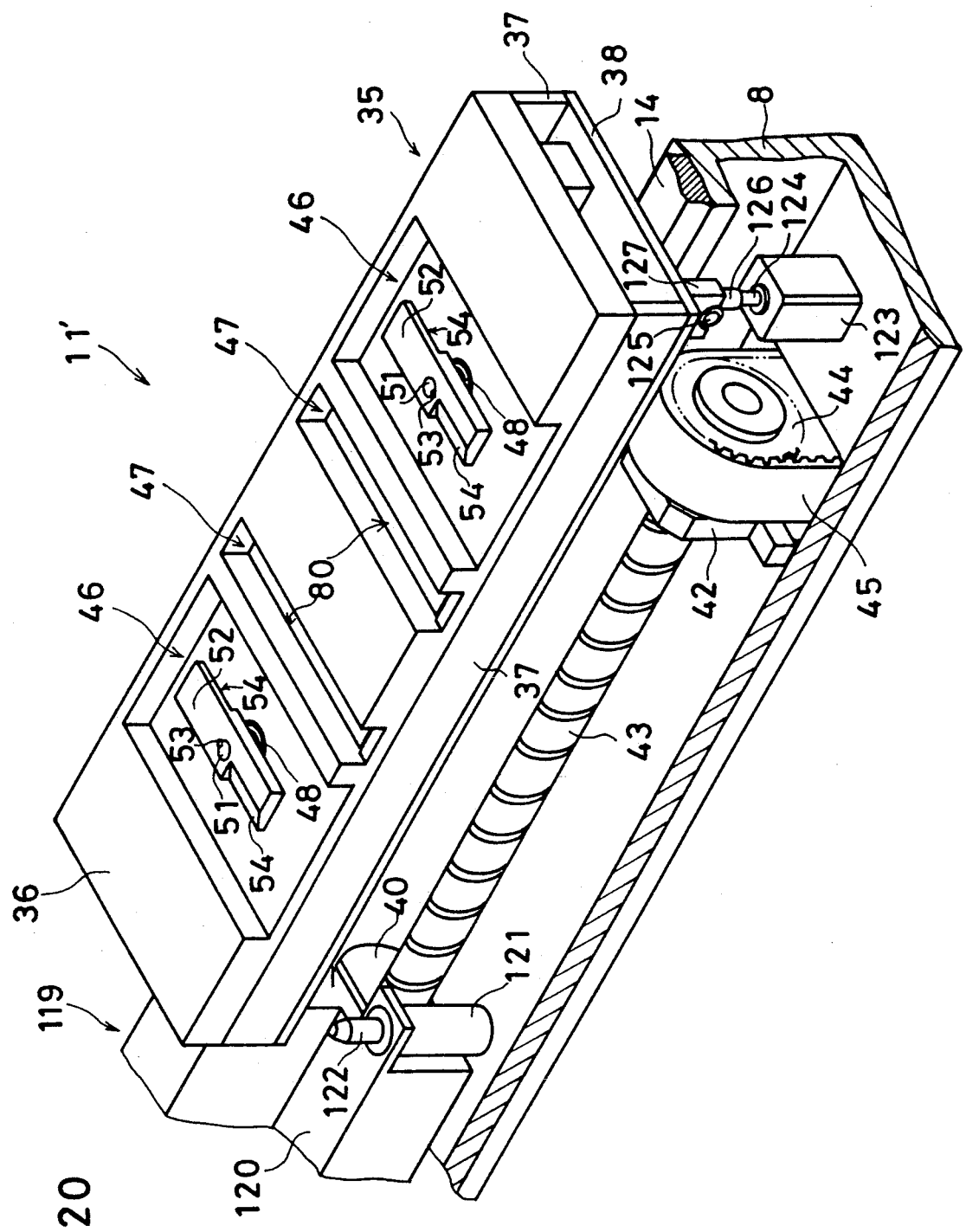
FIG. 20 is a partially cut-away perspective view showing a major portion of a table positioning unit of FIG. 19 embodiment.

The table truck 11' is shown in FIG. 20 in detail. The table truck 11' is constructed substantially the same manner as that of the table positioning unit 11 as shown in FIG. 4 except for the following points. More specifically, the table truck 11' includes a tractive member 119 as a moving means for the box 35. The tractive member 119 includes an air cylinder 121 fixed to a main body block 120. By projecting a rod 122 of the air cylinder 121 to be inserted in a hole (not shown) formed on the bottom plate of the box 35, the tractive member 119 can be connected to the box 35. The air cylinder 121 is provided for each of table trucks 11'. The nut 40 is fixed to the lower portion of a main body block 120, and the lead screw 43 supported in the vicinity of the both ends by the bearing blocks 42 is threaded into the nut 40. As described above, the pully 44 which is rotated by the belt 45 is fixed to one end of the lead screw 43. Therefore, when a driving force from a driving motor (not shown) is given to the pully 44 through the belt 45, the lead screw 43 is rotated. Responsively, the tractive member 119 is moved along the rail 14, and therefore, the box 35 connected to the tractive member 119 follows thereto to be moved.

In the vicinity of the terminations outside the standby areas 17 and 18, an air cylinder 123 for locking the table truck is provided, and a pusher rod 126 to which a roller 125 is attached is connected to a rod of the air cylinder 123. A block 127 is fixed to the bottom plate 38 of the box 35. If the rod 124 of the air cylinder 123 is projected, the roller 125 is fitted into a concave portion formed on the block 56, whereby the box 35 is maintained in the standby area 17 or 18.

The table truck 11' as shown in FIG. 20 is utilized instead of the table positioning unit 11 of the previous embodiment, it is operated in the following manner.

When the parts feeding table 9 or 10 is transferred by the table transport unit 12 or 13, the table truck 11' is waiting for the parts feeding table 9 or 10 in a state shown in FIGS. 5, 7 and 9. For convenience, description is now made assuming that the table transport unit 12 transports the parts feeding table 9 to the table truck 11'.

On this occasion, the lever 63 is drawn up to the position shown in FIG. 7 by the coil spring 69. Accordingly, the slide rod 58 is shifted to the right in FIG. 7. The roller 57 on the slide rod 58 maintains the clamper 52 at a right angle to the direction of movement of the table truck 11'. The cam shaft 76 connected to the supporting shaft 51 pushes up the up-and-down base 80 by the plate cam 77 at this time. The parts feeding table 9 enters this place. The roller 26 is caused to run onto the up-and-down base 80 in its raised position. The parts feeding table 9 covers the table truck 11' with the lower surface thereof not being in contact with the table truck 11'.

At this time, the lock blocks 29 enter the groove 46 with the clamper 52 being interposed therebetween. When the parts feeding table 9 is completely overlapped with the table truck 11', the rotary actuator 72 begins to rotate the arm 74. The arm 74 is rotated in a clockwise direction in FIG. 7 to cause the roller 75 to enter the yoke portion 67 of the lever 63, thereby to rotate the lever 63 in a counterclockwise direction against the coil spring 69. Consequently, the slide rod 58 is shifted to the left shown in FIG. 7. Accordingly, the supporting shaft 51 is rotated in a clockwise direction as viewed form above. The clamper 52, together with the supporting shaft 51, is also rotated. One of the blade portions of the clamper 52 is engaged with the lock block 29 having the stepped portion 28 inclined upward to pull the same downward, while the other blade portion thereof is engaged with the lock block 29 having the stepped portion 28 inclined downward to pull the same upward. As a result, the parts feeding table 9 is fixed without being shaky. Furthermore, at the same time, the cam shaft 76 is rotated, to lower the up-and-down base 80 to its lowered position, thereby to seat the parts feeding table 9 on the table truck 11'. This results in a state shown in FIGS. 6, 8 and 10.

The rotary actuator 72 continues to rotate the arm 74 until the roller 75 is pulled out of the yoke portion 67. After the arm 74 is detached from the yoke portion 67, however, the slide rod 58 continues to be held in the position shown in FIG. 8 by the friction between the lock block 29 and the clamper 52. In order to reliably prevent the slide rod 58 from being returned, a suitable click device constituted by a ball and a spring may be provided for the clamper 52 or the slide rod 58 itself. The arm 74 is waiting at an angle shown in FIG. 8 until the table truck 11' is returned to take out the parts feeding table 9. If the table truck 11' is returned, the arm 74 starts to be rotated in a counterclockwise direction. The arm 65 is engaged with the lever 63, to return a connecting mechanism to the state shown in FIGS. 5, 7 and 9.

Figure 21:
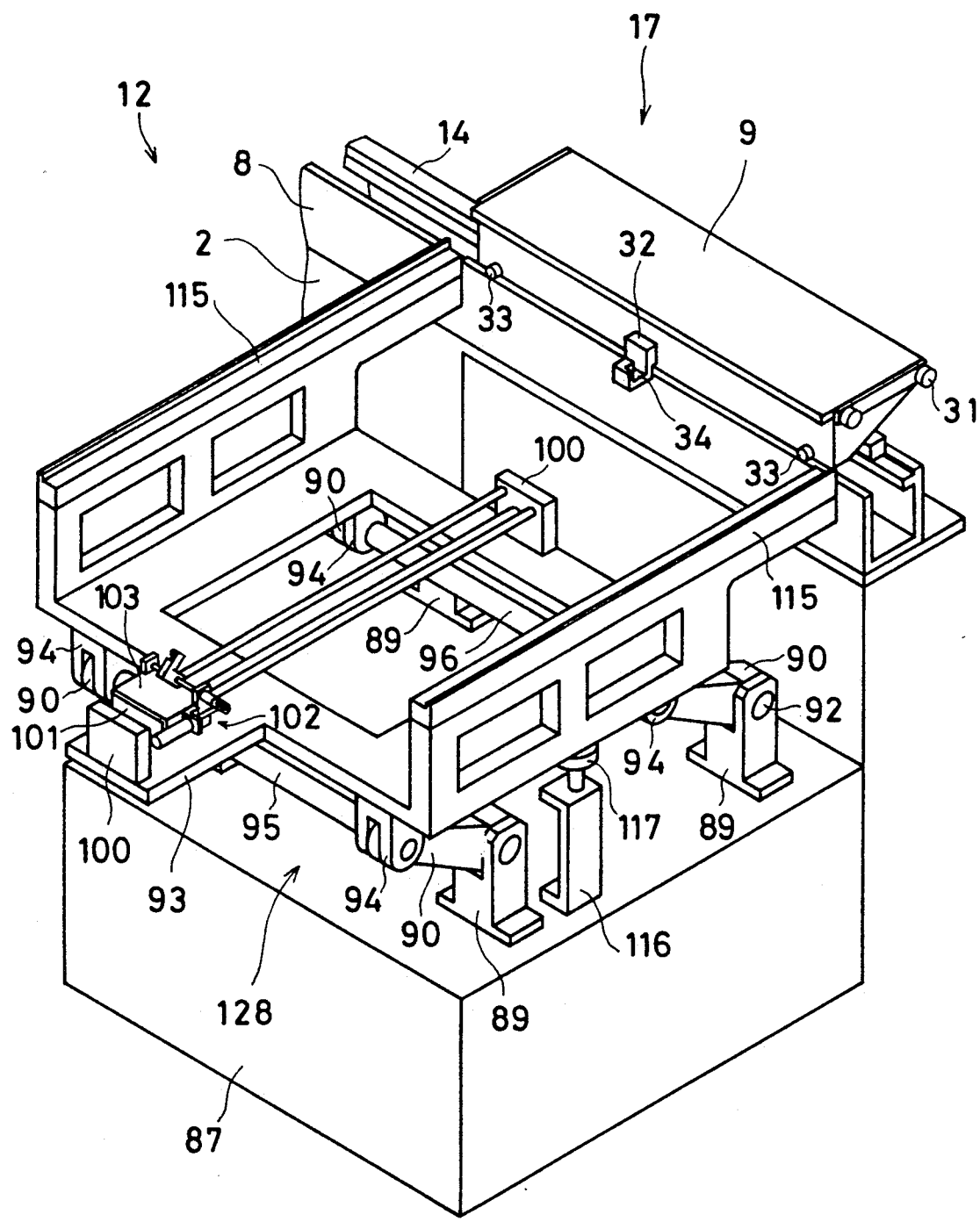
FIGS. 21 and 22 are perspective views respectively showing a major portion of a table transport unit of FIG. 19 embodiment and an operation state thereof.
Figure 22:
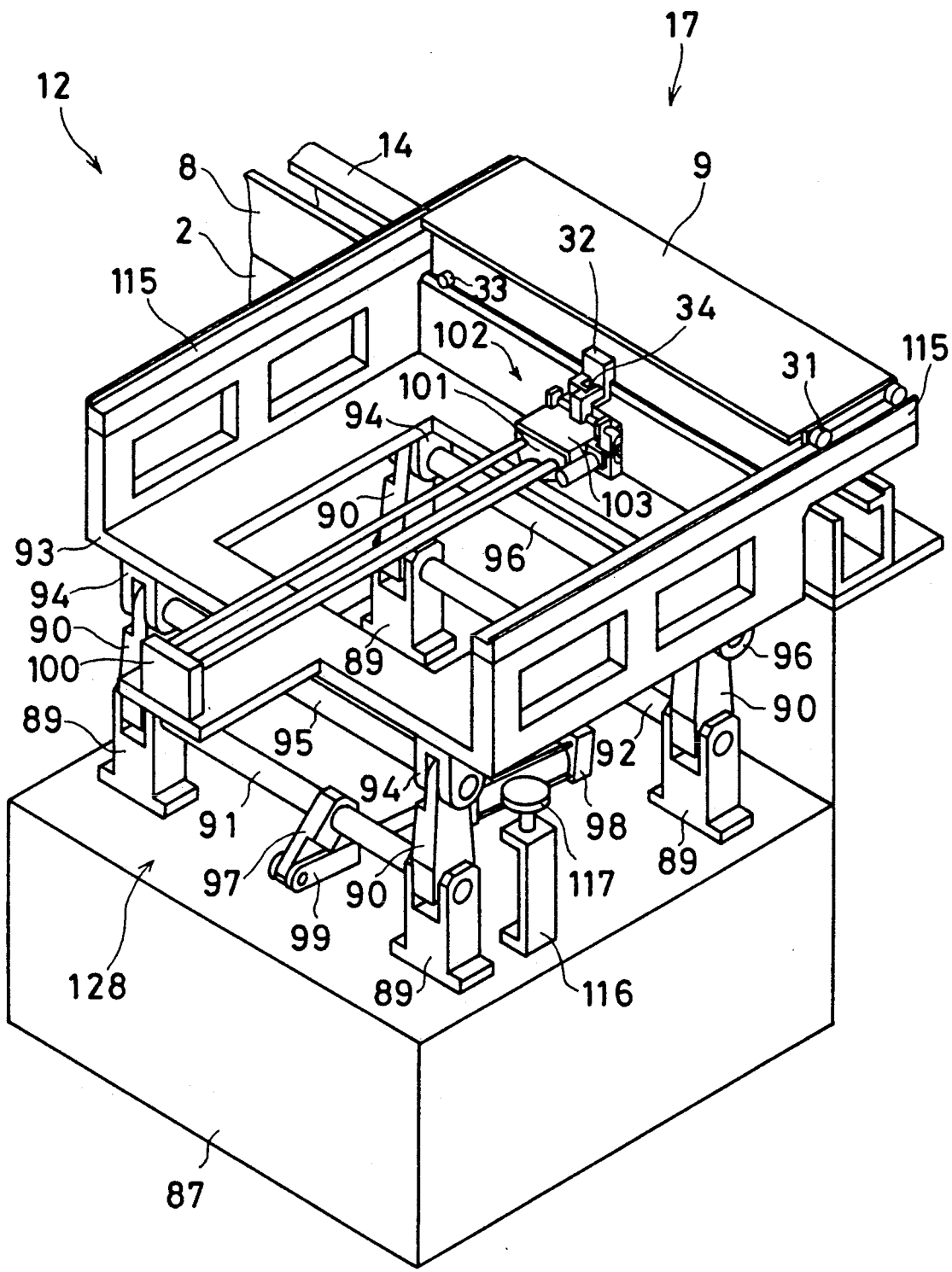

In FIG. 19 embodiment, the table transport units 12 and 13 are constructed as similar to that of FIG. 1 embodiment; however in this embodiment shown, as shown in FIGS. 21 and 22, the charge station 128 (or 129: FIG. 19) is formed outside (this side on FIGS. 21 and 22) the rails 115 of the table transport unit 12 (or 13).

If the parts feeding table 9 enters in the standby area 17 to exchange the parts cassette 24, the table truck 11' is locked by the air cylinder 123 (FIG. 20), and the tractive member 119 is disconnected from the table truck 11' and transferred toward the standby area 18 to go to meet a further table truck 11'. The connection between the parts feeding table 9 and the table truck 11' is released. Then, the rail base 93 is lifted up by the air cylinder 98. When the rail base 93 reaches its raised position, the roller 31 attached to the parts feeding table 9 runs onto the rail 115 (and at this time, the parts feeding table 9 comes up to the surface of the table truck 11' by the up-and-down base 80). The clamper 106 of the table tractive member 102 is connected to the connecting block 32 in the parts feeding table 9 (see FIG. 22). The table tractive member 102 then pulls the parts feeding table 9 into the direction of the termination of the rail 115. Subsequently, the rail base 93 is moved to its lowered position, and the parts feeding table 9 reaches the charge station 128. The work of exchanging the parts cassette in the charge station 128 is performed with the parts feeding table 9 being held by the table tractive member 102. However, the connection between the table tractive member 102 and the parts feeding table 9 can be released by depressing a switch (not shown). Consequently, the parts feeding table 9 can be replaced as a whole.

When the parts feeding table 9 is to be delivered to the table truck 11', the rail base 93 is first moved to its raised position, and the table tractive member 102 loads the parts feeding table 9 onto the table truck 11' (see FIG. 22). Thereafter, the table tractive member 102 is moved backward after being disconnected from the connecting block 32, and the rail base 93 is moved to its lowered position (see FIG. 21).

Description is now made on a series of operations of the parts feeding apparatus 4 of FIG. 19 embodiment with reference to FIGS. 23 to 26.

Figure 23:
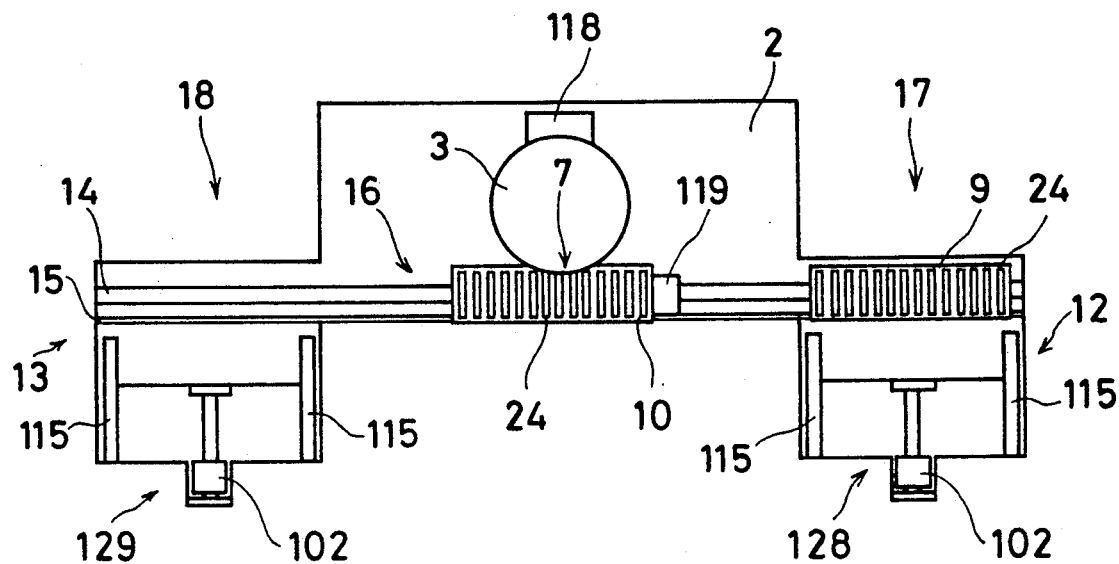
FIGS. 23-26 are illustrative top plan views showing a series of operations of a parts feeding apparatus of FIG. 19 embodiment.

In the state shown in FIG. 23, a parts feeding table 9 which is not associated with the feed of parts is waiting in the standby area 17. A parts feeding table 10 to be used is pulled together with the table truck 11' to the working area 16 from the standby area 18 by the tractive member 119. The tractive member 119 is moved throughout the working area 16 to place an arbitrary parts cassette 24 on the parts feeding table 10 in a parts taking-out position 7.

Figure 24:
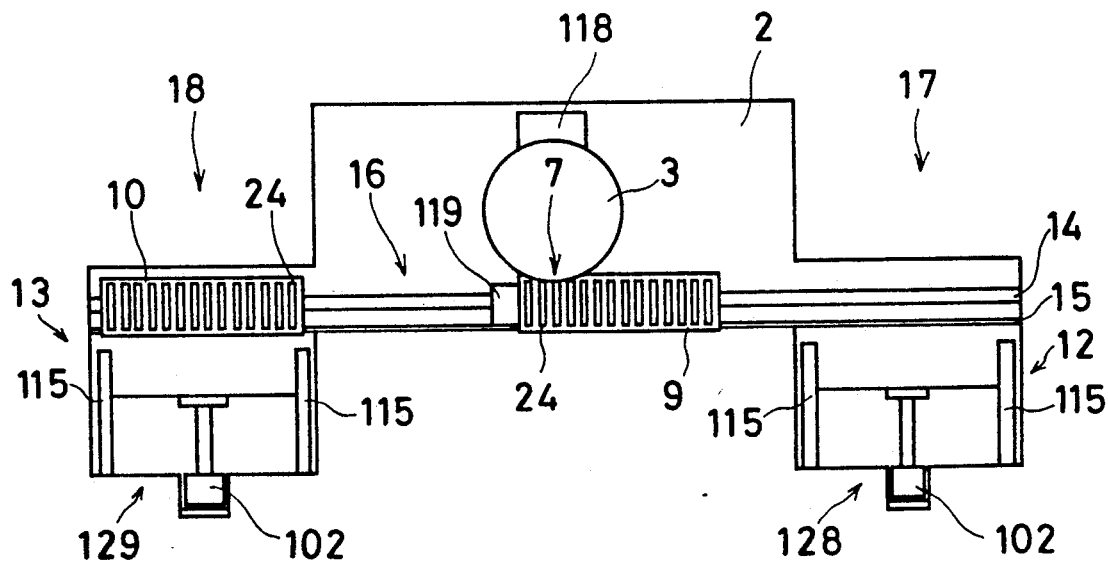
Figure 25:
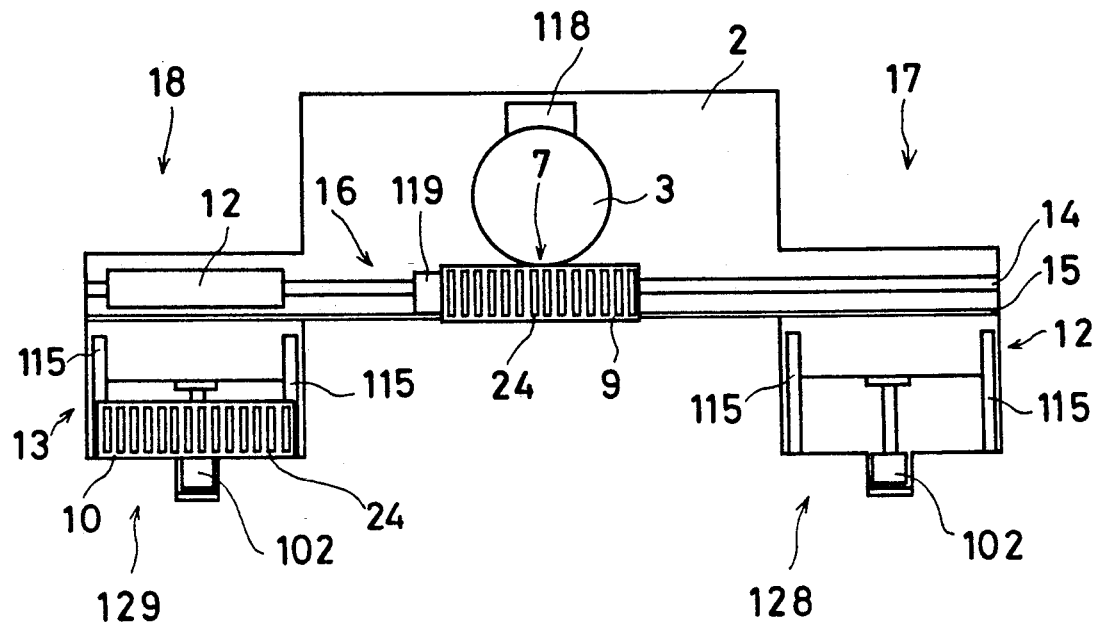
Figure 26:
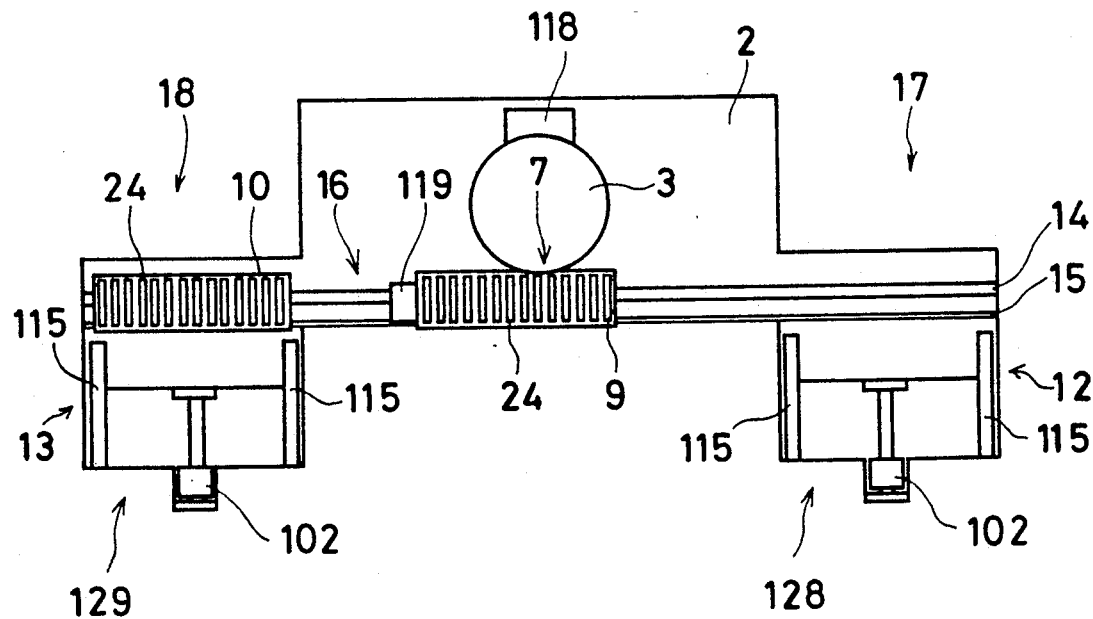

If there arises the necessity of replacing the parts feeding table 10 with the parts feeding table 9 in the standby area 17, the tractive member 119 sends the parts feeding table 10 in the standby area 18, alternately, pulls the parts feeding table 9 in the standby area 17 to start the feeding parts (see FIG. 24).

The parts feeding table 10 is disconnected from the table truck 11' at a time when the table truck 11' is placed in the standby area 18. The table transport unit 13 pulls the parts feeding table 10 into the charge station 129 (see FIG. 25).

When the parts feeding table 10 reaches the charge station 129, the operator rapidly perform the supplementation of the parts, or the exchange of the parts cassette, and in response the completion of such a work, the operator pushes the work termination switch (not shown). The parts feeding table 10 is laid on the table truck 11' by the table transport unit 13, to be connected to the table truck 11', to wait the next parts feeding (see FIG. 26).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A parts feeding apparatus, comprising:
a plurality of parts feeding tables each of said parts feeding tables holding a plurality of parts cassettes, each of said parts feeding tables including positioning means for positioning a parts cassette, and engagement means for engaging clamp means;
clamp means disposed on each of said plurality of parts cassettes for individually attaching and detaching respective parts cassettes from the parts feeding table through manual operation of said clamp means;
a table positioning unit movable along a table transfer path for loading at least one parts feeding table, said table positioning unit positioning said parts feeding table wherein an arbitrary parts cassette loaded thereon is brought to a predetermined position within a working area;
a standby area arranged in parallel with said working area; and
a table transport unit provided in connection to said standby area for unloading the parts feeding table from said table positioning unit and for loading the parts feeding table in said standby area to said table positioning unit.

2. A parts feeding apparatus in accordance with claim 1, wherein a width of said working area is formed so as not to project from said standby area.

3. A parts feeding apparatus in accordance with claim 2, wherein said table positioning unit includes a movable member on which said parts feeding table is loaded, said movable member being movable along said table transfer path, further comprising moving means for moving said movable member along said table transfer path.

4. A parts feeding apparatus in accordance with claim 3, further comprising fixing means for fixing said parts feeding table on said movable member.

5. A parts feeding apparatus in accordance with claim 4, wherein said fixing means including engaging portions provided on said moving member and said parts feeding table to be engaged with each other and holding means for holding a state where said engaging portions are engaged with each other.

6. A parts feeding apparatus in accordance with claim 3, wherein said table transport unit includes a table delivering means for delivering said parts feeding table being loaded on said movable member to said standby area or for delivering said parts feeding table from said standby area to load the same onto said movable member.

7. A parts feeding apparatus in accordance with claim 6, wherein said parts feeding table includes a first engaging portion and said delivering means includes a second engaging portion capable of engaging with said first engaging portion and moving means for moving said second engaging portion toward said working area or vice versa to deliver the parts feeding table between said working area and said standby area.

8. A parts feeding apparatus in accordance with claim 7, wherein said moving means moves said second engaging portion in a direction intersecting said table transfer path.

9. A parts feeding apparatus in accordance with claim 6, wherein said table transport unit includes an up-and-down mechanism for loading said parts feeding table on said movable member or for unloading said parts feeding table from said movable member when said parts feeding table is delivered by said delivering means between said working area and said standby area.

10. A parts feeding apparatus in accordance with claim 2, wherein standby area is also used as a charge station wherein a work such as supplementation of parts, exchange of parts cassette, or replace of parts feeding table can be performed by an operator.

11. A parts feeding apparatus comprising:
a plurality of parts feeding tables each of said parts feeding tables holding a plurality of parts cassettes;
each of said parts feeding tables comprising longitudinal alignment means for longitudinally aligning at least one parts cassette, said longitudinal alignment means including an alignment angle longitudinally placed on each parts feeding table, and a plurality of positioning pins also arranged on each table, wherein each parts cassette is aligned by said positioning pins and is firmly engaged to said alignment angle;

a table positioning unit movable along a table transfer path for loading at least one parts feeding table, said table positioning unit positioning said parts feeding table wherein an arbitrary parts cassette loaded thereon is brought to a predetermined position within said working area;

a standby area arranged in parallel with a working area; and a table transport unit provided in connection to said standby area for unloading the parts feeding table from said table positioning unit and for loading the parts feeding table in said standby area to said table positioning unit.

* * * * *